US008822301B2

(12) United States Patent
Kamath et al.

(10) Patent No.: US 8,822,301 B2
(45) Date of Patent: Sep. 2, 2014

(54) PROFILE ENGINEERED THIN FILM DEVICES AND STRUCTURES

(71) Applicants: Arvind Kamath, Los Altos, CA (US); Erik Scher, San Francisco, CA (US); Patrick Smith, San Jose, CA (US); Aditi Chandra, Los Gatos, CA (US); Steven Molesa, San Jose, CA (US)

(72) Inventors: Arvind Kamath, Los Altos, CA (US); Erik Scher, San Francisco, CA (US); Patrick Smith, San Jose, CA (US); Aditi Chandra, Los Gatos, CA (US); Steven Molesa, San Jose, CA (US)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 13/791,721

(22) Filed: Mar. 8, 2013

(65) Prior Publication Data
US 2013/0189823 A1 Jul. 25, 2013

Related U.S. Application Data

(62) Division of application No. 12/243,880, filed on Oct. 1, 2008, now Pat. No. 8,426,905.

(60) Provisional application No. 60/997,335, filed on Oct. 1, 2007.

(51) Int. Cl.
*H01L 21/20* (2006.01)

(52) U.S. Cl.
USPC ............. 438/381; 438/29; 438/780; 438/790; 257/40; 257/321; 257/347; 257/642

(58) Field of Classification Search
USPC ........ 438/29–30, 149, 780, 790, 794; 257/40, 257/321, 347, 642–643, E51
See application file for complete search history.

(56) References Cited

U.S. PATENT DOCUMENTS

| 6,087,196 A * | 7/2000 | Sturm et al. .................... 438/29 |
| 7,465,678 B2 * | 12/2008 | Bhattacharya et al. ....... 438/780 |
| 2006/0157692 A1 * | 7/2006 | Wada et al. .................... 257/40 |
| 2009/0311572 A1 * | 12/2009 | Roy et al. ....................... 429/34 |

* cited by examiner

*Primary Examiner* — Mark A Laurenzi
(74) *Attorney, Agent, or Firm* — Andrew D. Fortney; Murabito Hao & Barnes LLP

(57) ABSTRACT

The present invention relates to electrically active devices (e.g., capacitors, transistors, diodes, floating gate memory cells, etc.) having dielectric, conductor, and/or semiconductor layers with smooth and/or dome-shaped profiles and methods of forming such devices by depositing or printing (e.g., inkjet printing) an ink composition that includes a semiconductor, metal, or dielectric precursor. The smooth and/or dome-shaped cross-sectional profile allows for smooth topological transitions without sharp steps, preventing feature discontinuities during deposition and allowing for more complete step coverage of subsequently deposited structures. The inventive profile allows for both the uniform growth of oxide layers by thermal oxidation, and substantially uniform etching rates of the structures. Such oxide layers may have a uniform thickness and provide substantially complete coverage of the underlying electrically active feature. Uniform etching allows for an efficient method of reducing a critical dimension of an electrically active structure by simple isotropic etch.

18 Claims, 10 Drawing Sheets

PROFILE ENGINEERED THIN FILM DEVICES AND STRUCTURES

RELATED APPLICATIONS

This application is a divisional of U.S. patent application Ser. No. 12/243,880, filed Oct. 1, 2008, which in turn claims the benefit of U.S. Provisional Pat. Appl. No. 60/997,335, filed Oct. 1, 2007, both of which are incorporated herein by reference in their entireties.

FIELD OF THE INVENTION

The present invention concerns devices such as thin film capacitors, diodes (e.g., a Schottky diode), thin film transistors, and floating gate memory cells comprising a printed, smooth and/or dome-shaped semiconductor thin film feature. The present application discloses structures that can be manufactured using novel ink compositions and novel uses of low-cost printing technology. Exemplary process flows are described in U.S. patent application Ser. Nos. 11/818,078, 11/888,949, 11/888,942, and 12/114,741, filed on Jun. 12, 2007, Aug. 3, 2007, Aug. 3, 2007, and May 2, 2008, respectively, the relevant portions of which are incorporated herein by reference. Embodiments of the present invention relate to transistors, diodes, capacitors, and other structures formed using ink compositions for printing (e.g., inkjet printing, gravure printing, offset lithography, screen printing, flexography or flexographic printing, microspotting, pen-coating, stenciling, stamping, syringe dispensing, pump dispensing, spray-coating, slit coating, extrusion coating, meniscus coating, etc.).

DISCUSSION OF THE BACKGROUND

In a conventional, lithographically patterned device, a loss of charge due to leakage current may occur at cross-over locations where a gate electrode crosses over sharp/abrupt edges of an active feature (e.g., transistor channel) or other structure. FIG. 1 shows a conventional, lithographically defined transistor channel layer 102 formed over a substrate 101 and a dielectric layer 103 formed thereover. The dielectric layer 103, whether formed by oxidation or deposition, may have a non-uniform coverage of the lithographically formed channel layer 102 at the edges of the channel layer 102 (i.e., the upper edges of the channel layer 102 and where the channel layer 102 meets the substrate 101). A gate layer 104 is deposited over the dielectric 103. The dielectric layer may be substantially thinner at the edges of the channel layer 102, which can result in leakage current between the channel layer 102 and the gate layer 104 at the thinner parts of the dielectric layer 103.

Additionally, the gate layer 104 may cover the dielectric layer 103 and the channel 102 in a non-uniform manner. Blanket deposition of the gate layer 104 over a lithographically defined channel layer having sharp edges and substantially vertical sides may result in non-uniformity of the gate layer and discontinuities or gaps in the gate layer.

The leakage current and discontinuous gate layer deposition can be avoided by forming semiconductor features having smooth and/or dome-shaped geometry. Electrically active features having smooth and/or dome-shaped cross-sectional and/or longitudinal profiles can allow for smooth transitions without encountering sharp steps, preventing structural discontinuities during deposition of subsequent and/or overlying layers, and allowing for more complete step coverage of subsequently deposited structures. However, there have been challenges in precisely controlling certain critical dimensions in conventionally deposited or printed electrically functional features, especially high resolution dielectric, conductor, and semiconductor features.

Conventional printing processes may rely on an absorbing substrate (e.g., paper or cloth) to fix a position and a size of a deposited material (e.g., an ink). However, substrates typically used in manufacturing electronic devices are generally non-absorbing. The ink, as printed on a non-absorbing substrate, will behave as a liquid and will tend to move and/or spread until (or unless) the solvent is evaporated. Typically, the evaporation rate of the deposited ink is greatest near its edge, and liquid from the bulk of the deposited ink tends to flow to the edge as evaporation occurs, resulting in deposition of solute particles near the edge. This phenomenon is sometimes referred to as "coffee ring" formation. The coffee ring profile is undesirable for semiconductor, conductor and/or dielectric structures in microelectronic applications, and there is a need for printing processes that form semiconductor, conductor and dielectric features having a more uniformly distributed shape (e.g. a smooth, dome-shaped profile).

SUMMARY OF THE INVENTION

The present invention concerns devices that include relatively high performance devices containing one or more printed semiconductor (e.g., silicon), insulator (e.g., silicon dioxide) and conductor (e.g., metal) features and processes for manufacturing such features. More specifically, embodiments of the present invention relate to improved processes for making such devices using printed (e.g., inkjet printed) silicon, insulator and/or metal features and structures. Certain processes described herein allow for more precise control of critical and non-critical dimensions of semiconductor, insulator and conductor features (e.g., lines, rectangles, T shapes, L shapes, H shapes, dumbbell shapes, tabs, circles, squares, contact holes and/or trenches, combinations thereof, etc.) in printed electronic circuits and devices.

The shapes and profiles of features or patterns formed by printing liquid inks can be controlled by a combination of print process conditions. In order to print and fix an ink composition comprising precursors for an electrically active structure (e.g., a semiconductor or conductor structure) in an arbitrary shape (typically a line), the feature must be fixed or "pinned." Without a mechanism for pinning the liquid as the solvent evaporates, the liquid will generally retreat until it forms one or more spherical drops on the surface, rather than a line or other pattern. Parameters such as ink viscosity, ink contact angle, solvent evaporation rate, and substrate surface energy can be adjusted to achieve a printed feature or pattern that retains the shape in which it was printed and that has a dome-like and/or smooth, rounded cross-sectional profile after printing, drying, and/or curing. In many cases, the profile varies smoothly in both x and y (horizontal and vertical) dimensions, such that sharp transitions in the topology can be avoided (see, e.g., U.S. patent application Ser. No. 12/114,741, filed May 2, 2008, and U.S. patent application Ser. No. 11/842,884, filed Aug. 21, 2007, the relevant portions of each of which are hereby incorporated by reference). In the case of feature (e.g., an island or line) having a round shape from a top-down view, any cross section of the feature may have a smooth, and/or dome-shaped cross-sectional profile. In the case of a feature having differing length and width dimensions as shown in the top-down view of FIG. 2A, the cross-sectional profile across the width W may have a smooth and/or dome-shaped profile, as shown in FIG. 2B. The cross-sectional profile of the length of the feature will generally have a smooth profile and may also have a dome-shaped profile, at least near the ends of the feature. This allows for significant device reliability advantages that cannot be achieved easily in a conventional lithographically defined process.

For instance, smooth and/or dome-shaped features of printed, active silicon or metal allow for uniform growth of thermal silicon oxide over the printed features. Typically, due to stress effects at sharp edges (e.g., where a lithographically-defined semiconductor feature meets a substrate or an underlying feature), oxide growth can be retarded at these locations (e.g., at corners or edges), resulting in significantly thinner dielectric in certain locations. This can lead to enhanced electric field effects and/or leakage current at a given operating voltage at these locations. Specifically, thin portions of a thermal oxide layer covering an edge or corner, for instance, where a gate electrode crosses over a channel, can cause premature dielectric breakdown and leakage current.

The present invention provides significant advantages to the retention, lifetime and yield of electronic and semiconductor devices, including but not limited to transistors, diodes, capacitors, and floating gate memory cells. In a conventional, lithographically patterned device, a loss of charge due to leakage current may occur at cross-over locations (e.g., where one feature or structure crosses another). The leakage current can be avoided by forming semiconductor features having a smooth and/or dome-shaped geometry, as disclosed in the present application. Embodiments of the present invention include gate electrodes and other patterned features that do not cross over a sharp transition region or step, on or over channels (e.g., in the case of transistors) or other structures.

The smooth and/or dome-shaped profiles of the presently disclosed semiconductor, insulator and/or conductor features also allow for substantially uniform thermal oxidation of such features and/or controlled and substantially uniform isotropic etching (e.g., by wet etching or plasma etching) of the features. This provides simple and efficient methods of oxide formation and/or of reducing dimensions (e.g., critical dimensions) of the presently disclosed features. Critical and non-critical dimensions of the presently disclosed smooth and/or dome-shaped semiconductor and conductor features can also be reduced by thermal or chemical oxidation of the features and subsequent stripping (e.g., etching) of the oxide. The desired critical and non-critical dimension(s) can be achieved by adjusting the exposure time of the semiconductor feature(s) to the oxidation and/or etching conditions.

In general, the profiles of the presently disclosed semiconductor, dielectric, and conductor structures allow for smooth transitions without encountering sharp steps, thereby preventing discontinuities in the printed ink during deposition (e.g., by printing, for example inkjet printing, gravure printing, screen printing, etc.), and allowing for more complete step coverage of subsequently deposited structures. Materials that are subsequently formed by coating or printing over the smooth and/or dome-shaped semiconductor, dielectric and conductor structures will conformally cover the structures. For instance, a smooth and/or dome-shaped semiconductor structure allows uniform silicidation or contact formation. A metal silicide layer can be conformally formed or deposited over an entire gate structure having a smooth or dome-shaped profile. Additionally, a printed feature having smooth edges and a dome-shaped profile may also allow for uniform silicidation (or contact formation) across the entire surface of the dome. For a given dome area (e.g., footprint or outline of the feature on the device), the contact area may be larger than a lithographically defined feature of the same footprint or outline, thereby enabling a possible reduction in the ohmic resistance of the dome-shaped structure containing the metal silicide on its surface relative to an otherwise comparable, lithographically defined feature.

Also, a contact area on a smooth or dome-shaped semiconductor feature can be larger than a contact area of a similarly sized conventionally (e.g., lithographically) defined semiconductor or conductor structure because the contact metal can conformally cover the smooth and/or dome-shaped feature in the contact area, rather than just an upper surface of the conventional semiconductor or conductor feature having sharp edges between the upper and side surfaces. The contact resistance of a contact formed on the smooth and/or dome-shaped semiconductor feature will be reduced as compared to the contact resistance of the similarly sized conventionally defined semiconductor structure.

The absence of sharp transitions between semiconductor features (e.g., gates and channels) has the further advantage of enabling the use of electrode materials (such as molybdenum) which form discontinuous layers when deposited (and annealed) over sharp steps or transitions. In order to form an electrode from molybdenum in a conventional process, a high temperature resist reflow (which increases the critical dimension) and a sloped etch and/or use of alloying elements in or for the gate electrode is generally required.

A feature (e.g., an island) formed according to the presently disclosed methods can result in a substantially smooth and/or dome-shaped profile, as shown in FIGS. 2A-2B. An ink composition may be printed (e.g., by inkjet printing, gravure printing, offset lithography, screen printing, flexography or flexographic printing, microspotting, pen-coating, stenciling, stamping, syringe dispensing, pump dispensing, spray-coating, slit coating, extrusion coating, or meniscus coating) and the semiconductor, conductor, or dielectric precursor solute can be then precipitated (e.g., by heating the substrate and ink) to form a pinning line 202 at the edges of a printed pattern (precipitation occurs most rapidly at the edge of the printed ink pattern where the layer of ink is thinnest). The remaining solute in the "pinned" ink can then be precipitated, and the precipitated ink can then be cured and/or annealed to form a feature (e.g., an island) 200 having a smooth and/or dome-shaped profile.

FIG. 2A shows a top-down view of printed feature (e.g., island) 200 having a width W and rounded edges or ends 203. FIG. 2B shows a cross-sectional view of printed line or island 200 having a dome-shaped profile 204 across the width of the printed feature 200. Referring back to FIG. 2A, the cross-sectional profile along the length of printed feature 200 may be substantially dome-shaped along at least part of its length, and ideally, along its entire width and length. Alternatively, however, the printed feature 200 may be substantially dome-shaped along a part of its length (e.g., from the end 203 of the printed feature 200 to a point along the length axis L from the end 203 along the length axis L, for example in each half of the printed feature 200 defined by the plane normal to the length axis L at or about its midpoint). In one embodiment, the maximum height H of the printed feature 200 is less than the width W of the printed feature 200. Typically, the maximum height of the feature 200 is at least one or two orders of magnitude less than its width. The rounded edges 203 and smooth, dome-shaped profile 204 along or across at least one axis of the printed feature 200 may allow for significant device and reliability advantages, as discussed above, which cannot be achieved easily in conventional lithographically defined device features.

The cross-sectional profile of ideal structures obtained by printing (e.g., as shown in FIG. 3) may be mathematically defined by the value of the tangent at points along the upper surface of the cross-section as a function of the horizontal (X) dimension. The function that represents the curve at the surface of the dome-shaped profile must be continuous and have both a first derivative (e.g., dy/dx) and a second derivative (e.g., $d^2y/dx^2$) that are continuous functions. Such a surface may be considered to be "smooth" and/or "curved" in accordance with an ideal profile for embodiments of the present invention. FIG. 3 defines the intended cross-sectional profile of a printed feature having a cross-sectional width of W. $X_0$ represents the horizontal point at the maximum height of the feature. $X_0$ may optionally be the horizontal midpoint of the smooth or dome-shaped profile. The variable $x_i$ represents horizontal values that are less than $X_0$ (i.e., $0 \leq x_i < X_0$). The variable $x_{ii}$ represents horizontal values that are greater than $X_0$ (i.e., $X_0 \leq x_{ii} \leq W$). The tangent at any value of $x_i$ is given by $dy/dx_i$, and the tangent at $X_0$ is given by $dy/dX_0$. The dome-shaped profile of FIG. 3 can be defined for essentially any value of $x_i$ by $dy/dx_i > dy/dX_0$, wherein $dy/dx_i$ decreases (continually or substantially continually) at each successive, increasing value of $x_i$. The tangent at any value of $x_{ii}$ is given by $dy/dx_{ii}$. The dome-shaped profile of FIG. 3 can also be defined for any value of $x_{ii}$ by $dy/dx_{ii} < dy/dX_0$, wherein $dy/dx_{ii}$ decreases (continually or substantially continually) at each successive, increasing value of $x_{ii}$. For example, the tangent at a plurality of values of $x_i$ and $x_{ii}$ (e.g., at least 5, 10, 15, 25, etc., up to on the order of $10^2$, $10^3$, $10^4$, or more) may be determined, and a graph of the cross-sectional profile plotted therefrom. For essentially any number of selected values of $x_i$ and $x_{ii}$, $dy/dx_i$ and $dy/dx_{ii}$ should satisfy the mathematical descriptions in this paragraph.

The dome-shaped profile as defined in this paragraph and/or FIG. 3 provides the advantages of a printed semiconductor, metal, or dielectric feature having a smooth or dome-shaped cross-sectional profile as discussed herein. However, it should be understood that this mathematical description provides an ideal profile. In practice, there may be small imperfections or irregularities in the surface and/or profile of a feature printed in accordance with the presently disclosed methods. Thus, when determining the shape of the profile, data points may be taken for a number of points along its cross-section (e.g., the width or length). The values of $X_i$ and $X_j$, can have almost any granularity or interval (e.g., 1 μm, 100 nm, 10 nm, 1 nm, any value≥1 nm, or possibly <1 nm depending on the sensitivity of the instrument [e.g., a profilometer] that measures the thickness of the printed feature along the cross-sectional dimension). Alternatively, if the cross-sectional dimension is given by W, then the values of $X_i$ and $X_j$, can be taken as W/n, where n is an integer of at least 4 (e.g., at least 5, 10, 15, 25, $10^2$, $10^3$, $10^4$, $10^5$, or any value>4).

Embodiments of the present invention relate to devices (e.g., capacitors, diodes, transistors, and floating gate cells) comprising at least one layer having a semiconductor material (including Group IVA element[s]) or a metal material, and having a smooth and/or dome-shaped profile. The semiconductor material may comprise hydrogenated, dehydrogenated or non-hydrogenated amorphous, microcrystalline or polycrystalline silicon. The semiconductor material may also comprise germanium or a mixture of silicon and germanium. The metal material may comprise any metal appropriate for forming gates and/or contacts. Such metal gates and/or contacts can be formed by printing an ink comprising one or more metal precursors such as (organo)metallic compounds, (organo)metallic complexes, (organo)metallic clusters, metal nanoparticles, and combinations thereof. The device may further comprise layers (e.g., dielectric layers, semiconductor layer, and conductor layers) deposited or printed (e.g., inkjet printed) over the layer having the smooth and/or dome-shaped profile. In the present invention, the dimensions of all or substantially all of the printed layers in the device may be defined directly by parameters and/or conditions of the presently disclosed printing processes.

Further embodiments of the present invention provide an improved printing process for forming a semiconductor, dielectric, or conductor structure, such as islands, in electronic devices, including but not limited to transistors, diodes, capacitors, etc. The method of printing a structure on a substrate (e.g., printing a liquid semiconductor-containing ink to form functional layers) with more precisely controlled dimensions may include the steps of: (a) printing at least one semiconductor or conductor feature having a smooth and/or dome-shaped cross-sectional profile on a substrate, and (b) depositing additional functional layers thereover. The method may further comprise isotropically etching the at least one semiconductor or conductor feature to uniformly reduce critical dimension(s) of the at least one semiconductor or conductor feature. Alternatively, the method may comprise oxidation (e.g., thermal oxidation) of the at least one semiconductor or conductor feature to form a substantially uniform oxide layer covering the at least one semiconductor or conductor feature, and optional, subsequent removal of the oxide layer to reduce critical or non-critical dimension(s) of the at least one semiconductor or conductor feature. The method may also comprise depositing a conformal metal layer over all or a portion of the at least one semiconductor or conductor feature to form a silicide layer or a contact layer.

Embodiments of the present invention relate to electronic devices having improved smooth and/or dome-shaped profiles, and printing processes (e.g., inkjet printing) for forming the electronic devices. The described processes allow for relatively precise control of feature dimensions, and in preferred embodiments, provide the features with a smooth and/or dome-shaped cross-sectional profile along at least one dimension. This approach to forming printed structures may be cost effective due to (i) the efficient usage of the precursor materials and (ii) the combination of deposition and patterning into one printing step. The present invention may be applicable to the manufacturing of electronic devices in general, including but not limited to thin film transistors, capacitors, diodes, resistors, floating gate cells, and circuits containing the same on various substrates including, but not limited to, glass (e.g., display-type glass, quartz, etc.) sheets or slips, plastic and/or metal foils, sheets or slabs, silicon wafers, etc., all of which may further include one or more buffer, passivation and/or insulating layers (such as a polyimide or other polymer, silicon oxide and/or aluminum oxide, etc.) thereon. Applications of the circuitry include but are not limited to displays, RF devices, sensors, volatile and nonvolatile memory, photovoltaic cells, etc. Further benefits and other advantages of the present invention will become readily apparent from the detailed description of the preferred embodiments.

DETAILED DESCRIPTION OF THE PREFERRED EMBODIMENTS

Figure 1:
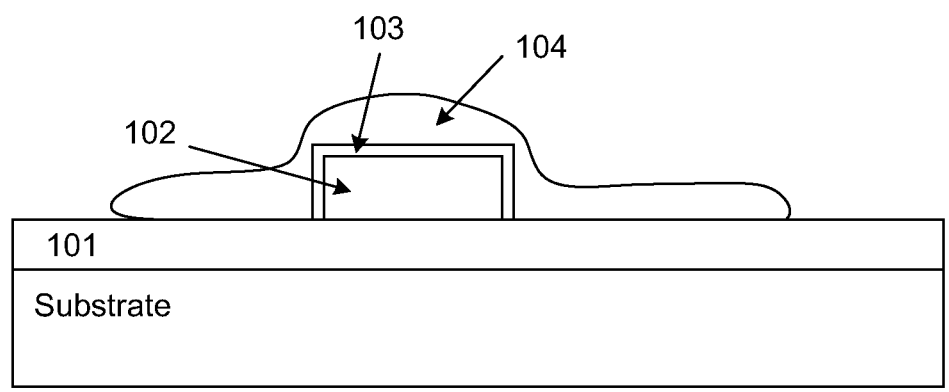
FIG. 1 shows a cross-sectional view of a lithographically patterned channel or gate electrode and a conductor or semiconductor layer printed thereover.

Reference will now be made in detail to certain embodiments of the invention, examples of which are illustrated in the accompanying drawings. While the invention will be described in conjunction with preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following disclosure, numerous specific details are given to provide a thorough understanding of the invention. However, it will be apparent to one skilled in the art that the present invention may be practiced without these specific details. In other instances, well-known methods, procedures, components, and circuits have not been described in detail, to avoid unnecessarily obscuring aspects of the present invention.

In the present invention, the term "deposit" (and grammatical variations thereof) is intended to encompass all forms of deposition, including blanket deposition (e.g., chemical vapor deposition [CVD] and physical vapor deposition [PVD], atomic layer deposition [ALD], slit coating, extrusion coating, meniscus coating, evaporation, etc.), (spin)coating, and printing. In various embodiments of the method of printing a functional electronic ink on a substrate, printing may comprise inkjetting, gravure printing, screen printing, offset printing, flexographic printing, spray-coating, microspotting, vapor-jetting, and/or pen-coating the metal formulation onto the substrate. Also, for convenience and simplicity, the terms "part," "portion," and "region" may be used interchangeably but these terms are also generally given their art-recognized meanings. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use. In addition, the term "doped" refers to a material that is doped with any substantially controllable dose of any dopant (e.g., lightly doped, heavily doped, or doped at any doping level in between). Furthermore, with regard to certain materials, the phrase "consisting essentially of" does not exclude intentionally added dopants, which may give the material to which the dopant is added (or the element or structure formed from such material) certain desired (and potentially quite different) physical and/or electrical properties. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width, the values of which may vary across the structure). For the sake of convenience and simplicity, the terms "coupled to," "connected to," and "in communication with" (and variations thereof) mean direct or indirect coupling, connection or communication, unless the context clearly indicates otherwise. These terms are generally used interchangeably herein, and wherever one such term is used, it also encompasses the other terms, unless the context clearly indicates otherwise.

The term "silane" refers to a compound or a mixture of compounds that contains primarily or consist essentially of (1) silicon and/or germanium and (2) hydrogen, the term "polysilane" refers to a compound or a mixture of compounds that predominantly contains (1) at least 15 silicon and/or germanium atoms and (2) hydrogen, and the term "(poly) silane" refers to a compound or a mixture of compound that includes one or more silanes and/or polysilanes. Such (poly) silane species (i.e., silane[s] and/or polysilane[s]) may contain one or more cyclic rings and be linear, branched or cross-linked. The term "(cyclo)silane" refers to a compound or a mixture of compounds that consists essentially of (1) silicon and/or germanium and (2) hydrogen, and that may contain one or more cyclic rings and less than 15 silicon and/or germanium atoms. The term "hetero(cyclo)silane" refers to a compound or a mixture of compounds that consists essentially of (1) silicon and/or germanium, (2) hydrogen, and (3) one or more dopant atoms such as B, P, As or Sb that may be substituted by a conventional hydrocarbon, silane or germane substituent and that may contain one or more cyclic rings. Such (poly)silane(s), (cyclo)silane(s) and/or hetero(cyclo)silane(s) may also contain an amount or atomic percentage of halogen atoms (such as Cl) that does not have a significant adverse effect on the properties of a given composition for a particular application.

The present invention concerns integrated circuit devices and methods of forming such devices by printing patterned material(s). Preferably, the patterned material comprises an electrically active material, such as a semiconductor (e.g., silicon and/or germanium), a metal, or a combination thereof (e.g., a metal alloy or a metal silicide). However, the present methods may additionally include printing and/or forming a dielectric material.

Printing an electrically active material is preferably achieved by printing an ink composition comprising a precursor of an electronically functional material. Techniques for local printing of a liquid semiconductor, conductor, or dielectric precursor ink directly onto a substrate (or surface film thereof) are described in U.S. Pat. Nos. 7,152,804, 7,314, 513, 7,619,248 and 7,879,696 and in copending U.S. patent application Ser. Nos. 11/203,563 and 12/114,741, filed on Aug. 11, 2005 and May 2, 2008, respectively), the relevant portions of which are incorporated herein by reference. The precursor may comprise one or more semiconductor, dielectric, and/or metal precursors, such as (poly)silanes, silicon and/or germanium nanoparticles, (organo)metallic compounds, (organo)metallic complexes, (organo)metallic clusters, metal nanoparticles, and combinations thereof. The method of printing the ink preferably comprises inkjet printing a liquid composition comprising a Group IVA element precursor or a metal precursor onto a substrate (or an underlying functional feature), wherein only predetermined portions of the substrate (generally corresponding to a pattern capable of being printed or inkjet printed) are covered with the composition. However, exemplary alternative printing techniques include gravure printing, offset lithography, screen printing, flexography or flexographic printing, microspotting, pen-coating, stenciling, stamping, syringe dispensing, pump dispensing, spray-coating, slit coating, extrusion coating, or meniscus coating, etc. The present invention may also include methods that utilize non-selective (e.g., blanket) deposition techniques such as spin-coating, slide-bar coating, spin coating, extrusion coating, meniscus coating, dip coating, spray coating, evaporation, etc., for forming materials that may be patterned by conventional techniques (e.g., photolithography, stamping, imprinting, etc.). The printing and/or coating technique may be further adapted for subsequent and/or simultaneous irradiation, for instance, with UV light (see, e.g., U.S. Pat. No. 7,498,015).

Printing (e.g., inkjet printing, screen printing, gravure printing, etc.) the semiconductor, metal and/or dielectric ink composition may be cost effective due to (i) the efficient usage of the precursor materials and (ii) the combination of electronic material deposition and patterning into one printing step. In some embodiments, printing (or otherwise depositing) the ink may be accompanied by substantially simultaneous or immediately subsequent irradiation with light (in one embodiment, UV light), generally at a wavelength and/or in a dose sufficient to cross-link the silicon-containing components of the ink, improve adhesion of the film to the substrate, and/or improve the film morphology (e.g., provide a desired cross-sectional shape).

Alternatively, one may conventionally deposit a semiconductor (e.g., silicon) or metal film (e.g., by PECVD, LPCVD, ALD, sputtering, evaporation, etc.). In the case of a semiconductor film, the deposited semiconductor material may be crystallized by UV laser exposure, thermal furnace or RTA annealing (optionally in the presence of crystallization promoters such as Au, Ni, Al, etc.), and then patterned by low-resolution photolithography and/or selective etching. Alternatively, the semiconductor film may be crystallized and/or densified by laser (e.g., UV laser) annealing, then the non-irradiated and/or amorphous portions of the deposited film may be removed by selective etching in accordance with known techniques. For example, techniques for selectively removing amorphous silicon in the presence of polycrystalline silicon are well-known in the art. A deposited metal precursor film (e.g., a film that includes a photodefinable metal-containing species) can be irradiated (e.g., by a UV laser) sufficiently to change the solubility characteristics of the exposed portions of the metal-containing film. The exposed or unexposed portions of the film may then be removed using a developer, depending on whether irradiation causes the metal precursor to become more or less soluble in the developer. Further details regarding the methods described in this paragraph can be found in U.S. Pat. Nos. 7,294,449, 7,619,248 and 7,879,696, the relevant portions of which are hereby incorporated by reference.

The substrate may comprise a wafer, plate, disc, sheet and/or foil of a semiconductor (e.g. silicon), a glass, a ceramic, a dielectric, plastic and/or a metal, preferably a member selected from the group consisting of a silicon wafer, a glass plate, a ceramic plate or disc, a plastic sheet or disc, metal foil, a metal sheet or disc, and laminated or layered combinations thereof. For example, the substrate may further include one or more dielectric, buffer, planarization, passivation, insulating and/or mechanical support layers (such as a polyimide or other polymer, silicon and/or aluminum oxide, etc.) thereon, which may themselves be patterned and/or have patterned semiconductor, conductor and/or dielectric features thereon. Thus, the ink may be printed directly on a portion of the coated substrate, or at least partially on one or more patterned features on the (coated) substrate. Such patterned features may have been formed by printing, photolithography, or other known patterning process. The present invention is particularly suited for printing (semi)conductor patterns on a thin sheet of plastic or metal foil coated with a dielectric material. The dielectric layer may have openings therein to facilitate electrical connections to the foil.

Plastic and metal substrates may further contain a planarization layer thereon to reduce the surface roughness of the substrate. In addition, the electrically conductive substrates (e.g., comprising or consisting essentially of a metal) generally have an insulator layer (e.g., a layer of the corresponding metal oxide) and/or a substantially amorphous conductive layer (e.g., a transition metal nitride, such as titanium nitride, tantalum nitride, or tungsten nitride) thereon.

In the case where the substrate comprises a metal sheet and/or foil, the device may further comprise an inductor, capacitor, and/or other electrically active structure, and the method may further comprise forming an inductor, capacitor, and/or other electrically active structure from the metal substrate. However, any such electrically conductive substrate should have an insulator layer between it and any electrically active layer or structure thereover, except in a location where electrical contact is to be made from the structures and/or devices on the insulator to a structure formed in the metal substrate (e.g., from one or more metal pads on an interposer, to an inductor and/or capacitor made from the metal substrate; see, e.g., U.S. Pat. Nos. 7,152,804 and 7,286,053, and U.S. patent application Ser. No. 11/243,460, filed on Oct. 3, 2005, the relevant portions of which are incorporated herein by reference).

The profile and dimensions of the structure formed from an ink printed on the substrate may be controlled and improved by adjusting the surface energy of the substrate to optimize the contact angle between the substrate and the printed ink (see U.S. patent application Ser. No. 12/114,741, filed May 2, 2008). The total spread of the printed liquid on the surface can be reduced by increasing the contact angle of the ink on the substrate. The reverse is also true: lower contact angles results in higher spreading of the ink. Desired contact angles can be adjusted for a specific application, desired feature dimensions, and/or desired topography. Depending on the application, desired contact angles for printed inks may be relatively low (e.g., from about <1° to about 15°, preferably from about <1° to about 5°), medium (e.g., from about 15° to about 45°, preferably from about 20° to about) 30°, or high (e.g., >45°). Such contact angles can be used to fine tune the feature width (and, directly or indirectly, the feature height). Line widths and other critical dimensions of printed features and structures can be further reduced, controllably and effectively by a controlled isotropic etch (e.g., a timed wet etch) of a printed feature having a contact angle of from <1° to 45°.

The surface energy of a substrate can be modified by printing a surface modifying agent or coating the substrate with such an agent to optimize the contact angle of printed liquids on a particular substrate (e.g., a Si wafer surface, a glass substrate, or a metal foil coated with $SiO_x$, a nitride, or a metal oxide surface layer, examples of which include silicon dioxide, $Al_yO_z$, TiN, etc) so that a desired pattern profile may be achieved. The particular coating used for substrate modification can be tailored to the surface being modified. For example, silazanes such as hexamethyldisilazane (HMDS), halosilanes such as trimethylsilyl chloride, and alkoxysilanes such as methyl triethoxysilane can react with and modify Si and/or silicon oxide surfaces.

Contact angles between the substrate and the printed ink can be lowered to below 5° (and as low as <1°) by cleaning a Si surface with aqueous $H_2O_2$ for 10 min, or with a "piranha" clean (a concentrated aqueous $H_2SO_4/H_2O_2$ solution) for 10 min that may optionally be followed by an aqueous $H_2O_2$ clean for 10 min (see U.S. patent application Ser. No. 12/114,741, filed May 2, 2008, the relevant portions of which are hereby incorporated by reference). In addition, medium contact angles (e.g., between 5° and 30°) can be created by taking an HMDS coated surface and reducing the coverage by controlled UV/ozone treatment for a predetermined time and at a predetermined UV power (e.g., 0.1-15 milliwatt/cm$^2$, for 10 seconds to 30 minutes), or controlled $O_2$/plasma treatment for a predetermined time and at a predetermined RF power (e.g., 1-5000 W, for 1 second to 60 minutes). Another method of partially or fully removing HMDS may include a high temperature bath (e.g., 30-90° C.) of $H_2O_2$ and $H_2SO_4$ (piranha) for a predetermined time (e.g., 1-60 minutes). These same methods or variations thereof may be adapted to other surface modifications and surfaces. For instance, the methods may be adapted to hydrophilic or hydrophobic surfaces.

Figure 2A:
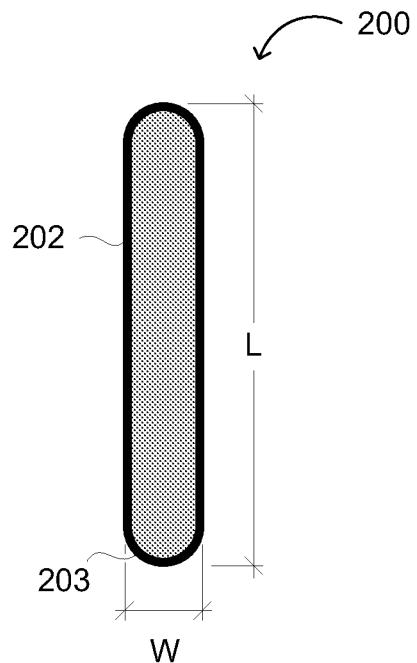
FIG. 2A shows a top-down view of an exemplary printed feature having a smooth, dome-shaped profile.
Figure 2B:
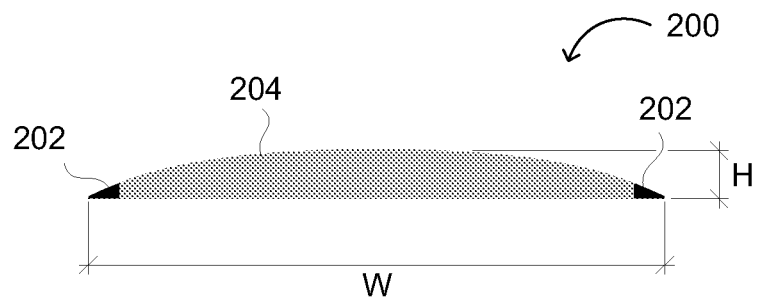
FIG. 2B shows a cross-sectional view of an exemplary printed feature having a smooth, dome-shaped cross-sectional profile.
Figure 3:
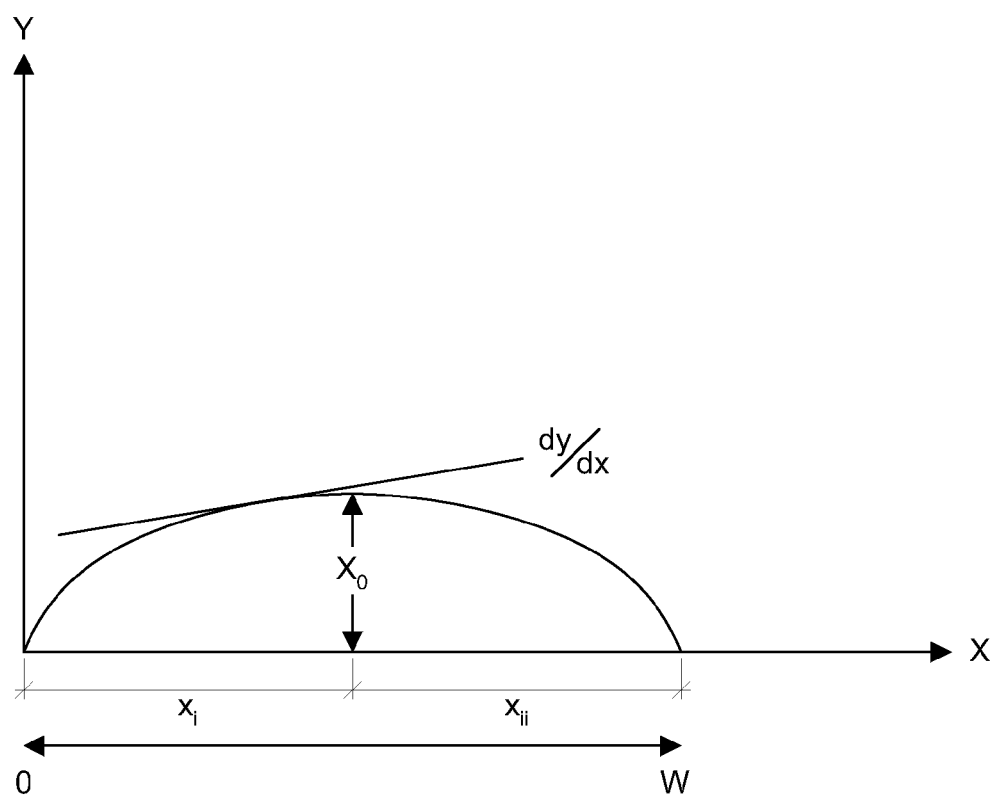
FIG. 3 shows a graphical representation of a printed semiconductor or metal feature having a smooth, dome-shaped cross-sectional profile.

The ink composition may comprise a semiconductor precursor, such as a (poly)silane, or a metal precursor. In certain embodiments, an ink composition comprising a doped or undoped dielectric may be printed on a substrate or functional feature. To form a feature with a predetermined cross-sectional profile (e.g., a smooth and/or dome-shaped profile) and/or shape (e.g., an anisotropic shape, such as a line, rectangle, T shape, L shape, H shape, dumbbell shape or tab, or another shape such as a circle or a substantially square pattern, any combination thereof, etc.), the liquid ink composition containing the semiconductor or metal precursor must be fixed or "pinned." As shown in FIGS. 2A and 2B, a solute (e.g., a (poly)silane) in a printed ink may be precipitated to form a pinning line 202 at the edges or edges of a printed feature (e.g., an island or other shape). Control of shape pinning may be improved by increasing the mass loading (i.e., the amount of precursor [e.g., (poly)silane] in the solvent), particularly when the viscosity of the ink composition correlates to the mass loading of the material precursor, and/or by irradiating (e.g., with UV radiation) the ink during or shortly after printing (e.g., within 0.1 sec to 10 sec), which may result in polymerization or cross-linking of the solute, and therefore precipitation of (further) precursors of electrically active materials. Controlling other process conditions (e.g., the molecular weight of the ink precursor, the ink viscosity, the evaporation rate of the solvent, the substrate temperature, irradiation [e.g., UV] power, irradiation [e.g., UV] wavelength, irradiation [e.g., UV] dose, etc.) may further control pinning and may allow improved reproducibility of the dimensions (e.g., feature width and height) of a printed feature. A balance of these processes may result in acceptable pinning within a reasonable time after printing. Additionally, controlling the evaporation rate of the solvent influences the point at which the solute precipitates, and therefore may influence when the pinning line forms.

The ink composition generally comprises (i) from 1 to 40% of a semiconductor, dielectric, or metal precursor, and (ii) a solvent in which the precursor material is soluble, wherein the composition has a viscosity of from 2 to 100 cP. In some embodiments, the ink composition may have a viscosity of from 2 to 15 cP. The solvent may include a hydrocarbon solvent.

In cases where the ink composition comprises a (poly) silane precursor, the (poly)silane may have an atomic purity of greater than 90% with respect to silicon, germanium and hydrogen (i.e., greater than 90% of the atoms in the [poly] silane are Si, Ge or H). In one example, the (poly)silane has an atomic purity of greater than 90% with respect to silicon and hydrogen. Thus, the (poly)silane can contain up to 10 at. % of other species (such as boron, gallium, phosphorous, arsenic, antimony, halogens [e.g., F, Cl, Br, etc.], carbon, oxygen, nitrogen, etc.) as long as the other species do not significantly adversely affect the electrical properties of a film formed from the (poly)silane for a given application. In certain embodiments, the (poly)silane may include a hetero(poly) silane, and further include one or more dopant atoms (e.g., B, Ga, P, As, or Sb) in an amount up to about 20 at. % (or any maximum value less than about 25-30 at. %) with respect to silicon, germanium, and the dopant element. Preferably, however, the (poly)silanes have an atomic purity of at least 95%, at least 99%, or any minimum value above 90 at. %, with respect to silicon, germanium and hydrogen. In a particularly preferred embodiment, the purity is at least 99.9% with respect to Si, Ge and H (or Si and H).

The (poly)silane precursor may include compounds such as hydrosilanes, hydrogermanes, hydrosilagermanes, (cyclo) silanes, (cyclo)germanes, (cyclo)silagermanes, (poly)silanes, (poly)germanes, and/or (poly)silagermanes, and/or silicon and/or germanium nanoparticles. Specifically, the (poly)silane may comprise compounds having the formula $A_nH_{2n+2}$ (e.g., $Si_nH_{2n+2}$, which may be linear, branched and/or crosslinked), cyclo-$A_mH_{2m}$ (e.g., $Si_mH_{2m}$), and/or polycyclo-$A_nH_{2n-p}$ (e.g., polymers containing multiple cyclic rings, or poly-crosslinked polymers of the formula $Si_nH_{2n-p}$), where A is Si and/or Ge, n is at least 5 (e.g., from 5 to 1,000,000, 10 to 1,000, 15 to 250, or any other range of values≥5 or ≥15), m is from 3 to about 20 (e.g., from 5 to 8, or any other range of values therein), and p is an even integer not greater than n. For example, linear, cyclic, polycyclic, cross-linked or branched silanes of the general formulae $Si_kH_2k+2$ or —$Si_kH_2k$—, where k is an integer of at least 5, 10, 15 20, or any value ≥5 (particularly where n is from 5 to 15), as well as germane and silagermane analogs thereof, may be made and/or polymerized by techniques disclosed in U.S. Pat. Nos. 7,314,513, 7,422,708, 7,498,015, 7,674,926, 7,879,696 and 8,211,396, and copending U.S. patent application Ser. No. 12/114,741, filed on May 2, 2008, the relevant portions of each of which are incorporated herein by reference.

Alternatively, the (poly)silane compound may comprise (or further comprise) one or more polymers or copolymers of one or more (cyclo)silanes having from 3 to 20 Si and/or Ge atoms (e.g., from 3 to 12, from 5 to 8, or any other range of values therein). For example, the (poly)silane may comprise a homopolymer of repeating -(-$A_kH_{2k}$—)— or -(c-$A_mH_{2m-2}$)— units, a block copolymer comprising one or more blocks of -(-$A_kH_{2k}$—)— and/or -(c-$A_mH_{2m-2}$)— units (each block of which may include one or more such units in a given block), or a random copolymer of such units, any of which may be branched, cross-linked, or (poly)cyclic (e.g., condensed, or cross-linked to itself), and where k and m are as described above. Methods of forming (poly)silanes as described in this paragraph are disclosed in U.S. Pat. No.

8,092,867. In addition, the (co)polymer may be linear, branched, cross-linked, cyclic, or polycyclic.

The (poly)silane composition preferably contains one or more relatively high molecular weight (poly)silanes having, e.g., 20, 30, 40, 50 or more silicon atoms therein. Such higher molecular weight (poly)silanes tend to increase the viscosity of the (poly)silane composition in proportion to their mass loading, thereby improving its properties for printing applications (e.g., inkjetting). The amount of the relatively high molecular weight (poly)silane(s) may vary, and is typically an amount providing a viscosity of from about 2 to about 100 cP (e.g., from about 2 to about 50 cP, from about 2 to about 25 cP, from about 2 to about 10 cP, from about 2 to about 5 cP, or any other range of values therein), but in many cases, it may range from about 1% to about 40% by weight of the ink (e.g., from about 1% to about 20% by weight of the ink, or any other range of values therein).

When the ink composition includes one or more Group IVA element precursors, the ink composition may further comprise one or more dopant sources, generally (but not exclusively) consisting essentially of one or more conventional semiconductor dopant atoms (e.g., B, P, As or Sb) and hydrogen, and which may have at least one substituent covalently bound thereto (e.g., a hydrocarbyl, silyl, germyl, or silagermyl group). The presence of a carbon-containing substituent on the dopant atom may not necessarily result in a significant increase in the amount of carbon in doped films formed therefrom, or in significant adverse effects on the electrical, physical and mechanical properties of such films, relative to undoped films formed from structurally analogous (poly)silane compounds. For example, the dopant source may have the formula $D_a R^1_{b'}$, where a' is 1 or 2; b' is 3a', at least a' instances of $R^1$ are $C_1$-$C_6$ alkyl, $C_6$-$C_{10}$ aryl, $C_7$-$C_{10}$ aralkyl or $AR^2_3$, where $R^2$ is hydrogen or $A_y H_{2y+1}$ (A is Si or Ge; and $1 \leq y \leq 4$, preferably y=1), and the remainder of the b' instances of $R^1$ are independently H, $C_1$-$C_6$ alkyl, $C_6$-$C_{10}$ aryl, $C_7$-$C_{10}$ aralkyl or $AR^2_3$. In various implementations, the dopant has the formula $D(AH_3)_3$, wherein D is P or B, and/or A is Si or Ge. The ink composition may contain suitable proportions of Group IVA element precursor(s) and dopant source(s) to provide a desired doping level in the final film. For example, from 0.00001 to about 20 vol. % (or any range of values therein, such as 0.001 to 10 vol. %) of the composition may consist essentially of the dopant source. Alternatively, the dopant source(s) may be present in an amount providing from about 0.0001 to about 10 at. % (or any range of values therein) of dopant atoms with respect to Si and/or Ge atoms in the Group IVA element precursor(s).

Alternatively, the ink composition may comprise one or more metal precursors such as (organo)metallic compounds, complexes, and/or clusters; one or more metal nanoparticles; and combinations thereof (see copending U.S. patent application Ser. No. 12/131,002, filed on May 30, 2008, the relevant portions of which are hereby incorporated by reference). For example, the (organo)metallic compounds, complexes, and clusters, as well as the metal nanoparticles, may include known compounds, complexes, clusters and/or nanoparticles of metals such as aluminum, titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, gallium, indium, thallium, tin, lead, and bismuth. Preferably, the (organo)metallic compounds, complexes, and clusters, as well as the metal nanoparticles, include one of the following metals zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, and mercury, more preferably hafnium, tantalum, molybdenum, tungsten, cobalt, nickel, palladium, platinum, copper, silver, and gold. The ligands, passivating agents, complexing and/or coordinating species, or other species included in or combined with such metal compounds, complexes, clusters and/or nanoparticles may be any that are capable of providing an electrically active film upon further processing of the ink.

A metal-containing ink (and, for that matter, any other printable ink disclosed herein) may be printed by essentially any conventional printing technology. For example, printing may comprise inkjet printing ("inkjetting"), screen printing, gravure printing, offset printing, flexography (flexographic printing), spray-coating, slit coating, extrusion coating, meniscus coating, microspotting, pen-coating, stenciling, stamping, syringe dispensing and/or pump dispensing the metal-containing ink in a predefined pattern. The ink may comprise or consist essentially of the metal precursor material and a solvent. The metal precursors that are generally compatible with printing or (selectively) plating may comprise organometallic compounds or nanoparticles (e.g., nanocrystals) of a metal such as titanium, copper, silver, chromium, molybdenum, tungsten, cobalt, nickel, gold, palladium, platinum, zinc, iron, etc., or metal alloys thereof, preferably silver or gold (or a metal alloy thereof). Such nanoparticles or nanocrystals may be conventionally passivated (e.g., with one or more surfactants), provided with one or more surface ligands (e.g., H atoms adsorbed thereon), or remain unpassivated. Plating may comprise, in one example, printing (e.g., by laser writing) a seed layer of metal (e.g., Pd) using nanoparticles or an organometallic compound of the metal, then selectively depositing (e.g., by electroless or electroplating) a bulk conductor (e.g., Al, Co, Ni, Cu, etc.) onto the printed seed layer. Alternatively, the ink may comprise or consist essentially of a conventional paste comprising a powder of one or more such metals or alloys thereof in a conventional binder.

However, preferably, the metal compounds, complexes, clusters and/or nanoparticles further include ligands, passivating agents, and/or complexing and/or coordinating species that consist essentially of atoms that do not adversely affect the electrical properties of such electrically active film(s), such as hydrogen, boron, silicon, phosphorous, gallium, germanium, arsenic, indium, thallium, tin, lead, antimony, bismuth, selenium and tellurium, particularly hydrogen, boron, silicon, phosphorous, germanium, arsenic, and antimony. In certain cases, particularly labile carbon-containing groups, such as a t-butyl group, may be present as a ligand on the metal precursor or as a substituent on a ligand, passivating agent, and/or complexing and/or coordinating species.

Alternatively, metal layers may be formed by conventional metal deposition (e.g., conventional sputtering or evaporation) and photolithography, by conventionally dispensing or printing commercial metal pastes, by conventional electro- or electroless plating, or alternatively, by laser patterning techniques to yield metal source/drain (and optionally, gate) contacts. For example, deposition may include sputtering a relatively thin barrier and/or adhesive layer such as Ti, TiN or a TiN-on-Ti bilayer, then a relatively thick bulk conductor layer, such as Al or Al—Cu alloy [0.5-4 wt. % Cu], followed by conventional photolithographic definition of contacts and metal features that are subsequently etched, preferably wet etched using a conventional $NH_4OH/H_2O_2$ etch composition that selectively etches metals such as Al, TiN and Ti relative to a metal silicide. In other embodiments, the blanket depositing step may comprise spin-coating an ink containing the metal-containing material, the metal-containing material may comprise metal nanoparticles and/or organometallic precursors of one or more of the metals disclosed above, and/or the method may further comprise the step of curing or annealing the metal, organometallic precursor(s) and/or metal nanoparticles, and/or other deposition techniques using metallic inks as discussed above. Coating or blanket-depositing, then patterning, a metal material generally will not form a feature having a smooth and/or dome-shaped profile, unless the metal material is conformally deposited onto a feature or structure having a smooth and/or dome-shaped profile.

In alternative processes, a metal precursor material layer may be coated or printed and locally exposed to laser radiation such that it changes its solubility characteristics in the exposed areas (see, e.g., U.S. Pat. No. 7,294,449, the relevant portions of which are incorporated herein by reference). Upon washing away the unexposed area, the irradiated metal precursor stays behind to form a metal layer, optionally after an additional curing or annealing step (so-called "negative" patterning and developing). Alternatively, "positive" patterning and developing may be employed, in which the area exposed to radiation is washed away.

Laser patterning may further comprise the substeps of depositing a resist material on a blanket deposited metal-containing layer, selectively irradiating portions of the resist material with a beam of light from a laser having (i) a predetermined width and/or (ii) a predetermined wavelength or wavelength band absorbed by the resist (or by an absorptive dye in the resist), developing the selectively irradiated resist with a developer to leave a pattern corresponding to the structure being formed (note that these steps apply to both positive and negative resists), removing those portions of the blanket deposited material not corresponding to the desired or predetermined pattern (typically by dry or wet etching), and removing the remaining resist material (see copending U.S. patent application Ser. No. 11/203,563, filed on Aug. 11, 2005, the relevant portions of which are hereby incorporated by reference). Preferably, the light has a wavelength in the infrared (IR) band (although it could also comprise a wavelength or wavelength band in the ultraviolet (UV) and/or visible band of the spectrum), the resist (or dye) absorbs and/or is sensitive to that wavelength or band of light, and the light beam is focused on or directed at the desired or predetermined portions of the resist.

The solvent in the present composition (e.g., an ink comprising semiconductor, metal, or dielectric precursors) may be one that provides a relatively high degree of stability to the ink composition, provides an advantageous viscosity and volatility (e.g., sufficient to prevent nozzle clogging and allow printed ink to dry at relatively low temperatures and relatively short times [e.g., as described herein]) and/or that is generally easily and/or thoroughly removable from the composition. For example, the solvent preferably is one that is substantially completely removed by printing the ink onto a platen at a temperature of 30-90° C., followed by heating for 10 min at 100° C. Thus, the solvent preferably comprises one or more hydrocarbon solvents, such as an alkane, a monocycloalkane, a bicycloalkane, a substituted monocycloalkane, a substituted bicycloalkane, a (cyclic) siloxane and/or a fluoroalkane. The solvents are generally those that are liquid at ambient temperatures (e.g., 15-30° C.). Thus, the solvent may be selected from the group consisting of $C_5$-$C_{12}$ linear and/or branched alkanes; $C_6$-$C_{12}$ monocycloalkanes; $C_3$-$C_8$ monocycloalkanes substituted with from 1 to 2n $C_1$-$C_4$ alkyl or halogen substituents or from 1 to n $C_1$-$C_4$ alkoxy substituents, where n is the number of carbon atoms in the monocycloalkane ring; siloxanes of the formula $(R_3Si)(OSiR_2)_p(OSiR_3)$ and cyclosiloxanes of the formula $(SiR'_2O)_q$, where p is from 0 to 4, q is from 2 to 6 (preferably from 3 to 5), each R and R' is independently H, $C_1$-$C_6$ alkyl, benzyl or phenyl substituted with from 0 to 3 $C_1$-$C_4$ alkyl groups (preferably R' is methyl); and $C_3$-$C_8$ fluoroalkanes substituted with from 1 to (2 m+2) fluorine atoms and that are liquid at ambient temperatures, where m is the number of carbon atoms in the fluoroalkane. In a preferred embodiment, the solvent comprises a $C_5$-$C_{10}$ cycloalkane (e.g., cyclohexane, cycloheptane, cyclooctane, cis-decalin, etc.). In another embodiment, the solvent comprises one or more $C_5$-$C_{10}$ mono- and/or bicycloalkanes, which may be substituted by up to 3 $C_1$-$C_4$ alkyl groups. However, other apolar and/or non-polar solvents (e.g., saturated hydrocarbons such as $C_5$-$C_{12}$ alkanes, aliphatic ethers such as di-$C_2$-$C_6$ alkyl ethers, methyl $C_4$-$C_6$ alkyl ethers and di-$C_1$-$C_4$ alkyl $C_2$-$C_6$ alkylene diethers [e.g., glyme], cyclic ethers such as tetrahydrofuran and dioxane, arenes such as benzene, toluene and xylenes, etc.) may be included in the present composition.

The composition may further comprise one or more conventional additives, such as a surface tension reducing agent, a surfactant, a binding agent, a thickening agent, a photosensitizer, etc. Preferably, however, the composition is free from components that may introduce atoms or other species that may adversely affect the electrical properties of a thin film formed from the composition (e.g., carbon, nitrogen, alkali metals, etc.). When they are present, typical amounts of these components in the composition are from 0.01 wt. % to 10 wt. % (e.g., in trace amounts, or from 0.1 wt. % to 5 wt. %) of the composition. The surface tension reducing agent may be present in an amount of from 0.01 wt. % to 1 wt. %, preferably 0.02 wt. % to 0.1 wt. % of the ink composition. In certain embodiments, the surface tension reducing agent may comprise a conventional hydrocarbon surfactant, a conventional fluorocarbon surfactant or a mixture thereof. The wetting agent may be present in an amount of from 0.05 wt. % to 1 wt. %, preferably 0.1 wt. % to 0.5 wt. % of the ink composition. However, in an embodiment of the present ink including one or more relatively high molecular weight (poly)silanes (e.g., as described above), the relatively high molecular weight (poly)silane(s) may be effective to improve the wetting characteristics of the ink. The surfactant may be present in an amount of from 0.01 wt. % to 1 wt. %, preferably 0.05 wt. % to 0.5 wt. % of the ink composition. The binder and/or thickening agent may be present in an amount sufficient to provide the ink composition with predetermined flow properties at a given processing temperature.

However, such additives are not at all necessary. In fact, it is advantageous to exclude the additives from the ink, particularly where such additional components include sufficiently high molar proportions of elements such as carbon, oxygen, sulphur, nitrogen, or halogens to adversely affect electrical properties of the resulting thin film. As a result, the present composition may consist essentially of (1) the semiconductor, metal, or dielectric precursor and (2) the solvent. Alternatively, in the case of a semiconductor ink, the present composition may consist essentially of the (poly)silane, without the addition of a solvent. However, use of a "solventless" semiconductor inks in printing applications may involve adjustments to the printing and/or irradiation conditions, such as irradiation power, timing, etc.

In one embodiment, the semiconductor ink comprises Group IVA precursor ink composition consisting essentially of components in the liquid phase at ambient temperatures. Use of all liquid phase components may avoid a number of problems associated with use of solid-phase components, such as non-uniformities in the distribution of the components in the composition (e.g., the composition is in the form of a colloid or suspension) and/or in the thin film formed on the substrate (e.g., the solid-phase component[s] tend to move along the substrate surface at a lower rate than the liquid-phase components in the composition).

Preferable process conditions for inkjet printing a semiconductor, dielectric or metal precursor ink composition may include a mass loading of 1-40 wt. % (preferably 20-30 wt. %) of the solute material, an ink viscosity of 2-100 cP (e.g., 2-15 cP, or any other range of values therein), and a printing frequency of about 1-100 kHz (preferably 5-50 kHz, 10-25 kHz, or any other range of values therein). In the case of either a (poly)silane or a metal precursor ink, the substrate may be contemporaneously heated in accordance with a desired solvent evaporation rate (typically in a range of from 30° C.-90° C., depending on the solvent to be evaporated). Additionally, the feature pitch or feature-to-feature spacing (which may be the same or different along each axis of a two-dimensional layout) may be about 1-500 μm (or any range of values therein), and the contact angle between the printed ink and the substrate may be from 0° to about 90° (or any range of values therein). A contact angle of 0° refers to a contact angle measured at 0°, but in reality, such a contact angle is slightly greater than 0°. Heating the substrate during the printing process may result in evaporation of a portion of the solvent from the printed ink, which in turn forms a pinning line (such as the pinning line 202 shown in FIGS. 2A-2B) at the thinner exterior areas of the printed ink.

The printing process may be conducted under an inert and/or reducing atmosphere. Thus, printing may include purging an atmosphere in which the substrate is placed, then introducing an inert and/or reducing gas into the atmosphere, prior to printing. In various embodiments, the inert and/or reducing gas may comprise He, Ar, $N_2$, etc., which may further comprise $H_2$, $NH_3$, $SiH_4$, and/or other source of gas-phase reducing agent (e.g., in an amount up to about 20 vol. %). The inert and/or reducing gas atmosphere may reduce any incidence of inadvertent and/or undesired oxide formation. In a preferred embodiment, the composition may be printed under an inert atmosphere (preferably with $O_2$ levels<<1 ppm) to avoid unacceptably high oxygen content in the formed films, which may result in poor device performance. In one embodiment, the inert atmosphere consists essentially of Ar, and may further include less than 0.1 ppm $O_2$ and less than 100 ppm $N_2$.

Optionally, the ink composition may be irradiated during or after the printing of the ink composition. The ink may be irradiated with light having a wavelength (or wavelength band) in the range of 200 nm to 450 nm, such as 220 nm to 400 nm, or 250 to 380 nm (or any other range of values therein) in the case of (poly)silane materials, or in the range of 250 nm to 1000 nm, such as 450 nm to 900 nm, or 480 to 780 nm (or any other range of values therein) in the case of metal precursor materials. Suitable sources for non-UV radiation include white light sources, Xe lamps, visible LEDs, UV LEDs coated with down-converting phosphors, IR lamps and lasers, visible lasers, etc., including sources of UV radiation having one or more UV filters positioned between the lamp output and the sample to be irradiated. A suitable source of UV radiation may comprise essentially any UV radiation source, such as a mercury vapor and/or mercury arc lamp, a UV LED, a UV laser, etc., or a white light source or other non-UV source having one or more visible and/or IR filters positioned between the lamp output and the sample to be irradiated, etc. The radiation dose may be in the range of 0.01 mJ/cm$^2$ to 1.2 J/cm$^2$, using a light source with a power output of about 0.1-15, 0.75-10 or 1-5 watt/cm$^2$ (or any other range of values therein), which may be transmitted directly or through a light guide or a slit, and/or which may be focused at the location of the substrate and/or the printed (poly)silane ink. To selectively irradiate only certain areas of the printed ink, the radiation from the lamp may be passed through a mask (e.g., a quartz plate having a chrome pattern thereon, which generally blocks UV radiation in areas where no exposure of printed (poly)silane ink is desired). The irradiating step is preferably conducted under an inert and/or reducing gas, as for the printing/depositing step, to reduce any incidence of inadvertent and/or undesired oxide formation.

While any form of radiation (and more particularly, any wavelength of light) may be used, the irradiating step preferably comprises irradiating with ultraviolet light. Such irradiation generally yields a film of cross-linked, oligomeric and/or polymeric hydrogenated (poly)silanes, which can later be converted (e.g., by heating) into an amorphous hydrogenated semiconductor film (e.g., an amorphous, hydrogenated silicon film) suitable for electronic devices, and which optionally forms a microcrystalline and/or polycrystalline film upon further annealing, as described herein. Thus, the present invention may provide commercial quality semiconductor features (e.g., semiconductor islands) from a printed liquid (poly)silane composition.

Generally, the printing method includes drying the printed ink composition at a temperature for a length of time sufficient to remove substantially all of the remaining solvent(s) from the ink composition. In other embodiments, drying comprises removing the solvent(s) in a vacuum, with or without applied heat. Evaporating the solvent may comprise heating the coated or printed precursor composition (and/or substrate) to a temperature of from about 30° C. to about 200° C. (e.g., from 30° C. to about 90° C., from 80° C. to about 120° C., or any other range of values therein). The length of time may be sufficient to remove substantially all of the solvent and/or substantially all of the additive(s) from the coated or printed precursor ink (e.g., from 1 second to 4 hours, 1 minute to 120 minutes, or any other range of values therein). The vacuum may be from 1 mtorr to 300 torr, 100 mtorr to 100 torr, 1-20 torr, or any other range of values therein, and may be applied by vacuum pump, aspirator, venturi tube, etc. The solvent can be evaporated under an inert atmosphere (preferably Ar, rather than $N_2$) with $O_2$ levels<<1 ppm to avoid unacceptably high oxygen content in the formed films.

In embodiments that include printing a metal precursor ink, the drying temperature may be from 30° C. to 300° C., 50° C. to 200° C., or any value or range of values therein. The length of time may be sufficient to remove substantially all of the solvent and/or substantially all of the additive(s) from the coated or printed metal precursor ink (e.g., from 1 second to 4 hours, 1 minute to 120 minutes, or any other range of values therein). In other embodiments, drying comprises removing the solvent(s) in a vacuum, with or without applied heat. The vacuum may be from 1 mtorr to 300 torr, 100 mtorr to 100 torr, 1-20 torr, or any other range of values therein, and may be applied by vacuum pump, aspirator, venturi tube, etc.

Printing the ink composition may further include a curing step to convert the dried, patterned precursor to a film of semiconductor, conductor or dielectric material. In the case of (poly)silanes, curing generally comprises heating the dried composition to a temperature of at least about 300° C. (preferably at least about 350° C., and more preferably at least about 400° C.) for a length of time sufficient to convert the composition to an amorphous, hydrogenated film comprising silicon and/or germanium. Such heating may be conducted for a length of time of at least 1 minute, 3 minutes or 5 minutes.

The curing step may remove unwanted precursor/ink components or byproducts such as volatile carbon-containing species, and, in the case of a semiconductor precursor ink, reduce the hydrogen content of the amorphous, hydrogenated semiconductor (e.g., a-Si:H) layer (which is particularly advantageous if laser crystallization is to be used after semiconductor film formation). The curing step may also activate part of the dopant in the semiconductor precursor ink, but in many embodiments, dopant activation may be more likely to occur during a subsequent laser crystallization or a relatively high-temperature annealing step.

The printing process may further comprise an annealing step, which may comprise heating the substrate and the printed, cured semiconductor, dielectric or metallic film to a temperature and for a length of time sufficient to provide the film with certain predetermined or desired characteristics or qualities (e.g., conductivity, morphology, electromigration and/or etch resistance, stress and/or surface strain, etc.). In the case of a metal precursor ink, annealing may improve the adhesion of the metal to the underlying structure (e.g., a gate oxide). Suitable annealing temperatures generally range from about 100° C. to about 500° C., or any range of temperatures therein (e.g., from about 150° C. to about 400° C.). Suitable lengths of time for annealing may range from about 1 minute to about 2 hours, preferably from about 10 minutes to about 1 hour, or any range of times therein (e.g., from about 10 to about 30 minutes). Annealing may be conducted in a conventional furnace or oven, optionally in an inert or reducing atmosphere. In a one embodiment, when the film being annealed comprises a hydrogenated, amorphous silicon and/or germanium film, heating to a temperature of from about 600° C. or more in a furnace, generally for a length of time of at least about 20 minutes, is sufficient to substantially dehydrogenate the amorphous silicon and/or germanium film. The curing processes can be performed in the same, pure inert atmosphere (preferably Ar, rather than $N_2$) with $O_2$ levels<<1 ppm, as described herein. The inert atmosphere may consist essentially of Ar, and may further include less than 0.1 ppm $O_2$ and less than 100 ppm $N_2$.

Controlling the process conditions (e.g., the mass loading, the molecular weight of the ink precursor, the ink viscosity, the substrate temperature, UV power, UV wavelength, the time interval between printing and irradiation, the surface energy of the substrate, etc.) may allow more precise control and reproducibility of the dimensions (e.g., width, length and cross-sectional profile) of a semiconductor, metal, or dielectric feature. The process conditions described above may sufficiently controlled to reproducibly form printed features (e.g., a metal, dielectric or semiconductor line, island, rectangle, T shape, L shape, H shape, dumbbell shape, tab, circle, square, combination thereof, etc.) having predetermined widths, lengths and cross-sectional profiles (e.g., a smooth and/or dome-shaped profile).

Typical thicknesses for the semiconductor and conductor device features may be from about 10, 25, 50, or 100 nm to about 200, 500 or 1000 nm, or any range of values therein. The film thickness may be chosen to optimize the electrical properties of the device to be formed (e.g., a capacitor or a non-volatile memory transistor). In addition, the semiconductor and conductor device features may have a width of at least 1, 5 or 10 μm, up to 50, 100, or 200 μm or more, or any range of values therein. The semiconductor and conductor device features may have a length of at least 1, 2, 5, 10 or 20 μm, up to 20, 50 or 100 μm or more, or any range of values therein.

Printed semiconductor and conductor device features having reproducible smooth and/or dome-shaped profiles provide a number of advantages over conventional, lithographically defined device features. For example, printed active semiconductor or conductor features having rounded edges and a smooth and/or dome-shaped profile along at least one axis allow for uniform growth of thermal oxide over the entire feature (e.g., over a channel region in a silicon thin film transistor). Typically, in a lithographically defined device, due to stress effects at sharp edges, silicon oxide growth may be retarded and may result in significantly thinner dielectric at these locations. This may lead to enhanced electric field effects and leakage for certain operating voltages at these locations, which can result in premature breakdown and leakage. The smooth and/or dome-shaped profiles and rounded edges of printed semiconductor, conductor, and/or dielectric features of the present invention substantially avoid such issues, and may significantly improve the quality, lifetime, and/or yield of devices formed therefrom.

Dielectric layers may be preferably formed over the smooth and/or dome-shaped electrically active device features disclosed herein by wet or dry thermal oxidation, which yields an oxide film having a uniform thickness and coverage over the device features. Alternatively, dielectric layers may be formed on the device features by printing or coating a suitable dielectric precursor and converting it to a dielectric film (e.g. liquid phase deposition of a $SiO_2$ precursor, such as a tetraalkylsiloxane or tetraalkoxysilane), liquid phase deposition of (metal) oxide(s) (e.g. $SiO_2$, $TiO_2$, $ZrO_2$, $HfO_2$, etc.), or conventional CVD, PECVD, LPCVD, ALD, evaporation, or sputter deposition of silicon oxide and/or nitride layers (e.g., see copending U.S. patent application Ser. Nos. 11/452,108, 11/818,078, 11/888,942, 11/888,949, and 11/842,884, filed on Jun. 12, 2006, Jun. 12, 2007, Aug. 3, 2007, Aug. 3, 2007, and Aug. 21, 2007, respectively, the relevant portions of which are incorporated herein by reference).

Thermal oxidation of a film formed according to the methods described above can be accomplished by heating the film in a suitable atmosphere (air, $O_2$, ozone, $N_2O$ or steam, or combinations thereof) to a temperature higher than about 600° C., preferably at least about 800° C., more preferably at least about 850° C. The maximum temperature may be about 1000-1100° C., more preferably about 900° C., to reduce, inhibit or prevent thermal damage (if any) to the substrate and/or films or structures thereon. In such an embodiment, a stainless steel film, sheet or foil may be a particularly advantageous choice for the substrate. The dielectric layer may have a thickness of from 20 Å to 400 Å or any range of values therein (e.g., from 30 to 300 Å, or from 50 to 200 Å, etc.).

A printed gate electrode or other electrically active feature having a smooth and/or dome-shaped profile and rounded edges may also allow for controlled isotropic etching after printing, which may provide a simple and effective method of reducing critical dimensions (such as gate length) in printed devices. In the case where two or more structures (such as metal interconnect) have a crossover point (and which may have one or more additional films between the features at the crossover point), the underlying feature(s) can be printed and have rounded edges and a smooth and/or dome-shaped profile in accordance with the present invention. The rounded edges and the smooth and/or dome-shaped profile may allow for smooth topological transitions without sharp steps, thereby preventing discontinuities in the overlying feature(s) and/or film(s) during the deposition and/or formation (e.g., by inkjet printing) of the feature(s) and/or film(s). As a result, more uniform step coverage of subsequently deposited or printed structures may be achieved. In the case of metal interconnect features, the thickness of an interlayer dielectric may be reduced (e.g., the thickness of the dielectric may be 100 Å or less) because sharp edges (typical of conventional lithographically-defined metal features) may be substantially avoided, and thus the problem of conformal coverage over sharp edges may be substantially obviated.

Figure 8A:
FIGS. 8A-8C show cross-sections of an exemplary printed semiconductor island or layer having a smooth and/or dome-shaped cross-sectional profile, and an exemplary method of reducing the dimensions of the semiconductor island or layer.
Figure 8B:
Figure 8C:
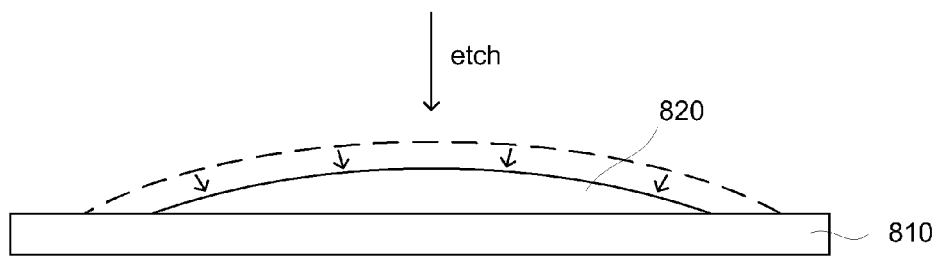

FIGS. 8A-8C show an example method for forming a semiconductor island 820 having a smooth and/or dome-shaped profile, forming a uniform oxide layer 830 by thermally oxidizing the semiconductor layer 820, and removing the oxide layer by an isotropic etch (e.g., a wet or dry isotropic etch). The resulting semiconductor layer 820 has reduced feature sizes (e.g., length, width, and thickness), while maintaining a smooth and/or dome-shaped profile.

As shown in FIG. 8A, the semiconductor layer (e.g., silicon) 820 is formed on a substrate 810. The semiconductor layer 820 may be formed by printing (e.g., inkjet printing) an ink composition comprising a semiconductor (e.g., silicon and/or germanium) precursor to form a pattern in accordance with the description above (e.g., printing a (poly)silane or hetero(poly)silane). The cross-sectional profile of the semiconductor layer 820 is substantially smooth and/or dome-shaped. The semiconductor layer 820 may be utilized as a feature in a transistor (e.g., a channel layer), a MOS capacitor, or a diode, as described herein.

Subsequently, as shown in FIG. 8B, a dielectric 830 may be formed by oxidizing (e.g., wet or dry thermal oxidation of) the semiconductor layer 820. Thermal oxidation of semiconductor layer 820, which has a smooth and/or dome-shaped profile absent of sharp transitions, results in a substantially uniform oxide layer that completely covers the semiconductor layer 820.

As shown in FIG. 8C, the dielectric layer 830 may then be removed (e.g., by wet or dry isotropic etching) to expose the semiconductor layer 820 and reduce its feature sizes (e.g., its length, width, and height). The resulting semiconductor layer 825 has reduced dimensions, but retains the smooth and/or dome-shaped profile, and the benefits thereof. In another embodiment, semiconductor layer 820, as shown in FIG. 8A, can be isotropically etched without the prior formation of a dielectric layer, resulting in the reduction in size as shown in FIG. 8C.

Additionally, a gate electrode or other electrically active feature formed on or over a semiconductor feature printed in accordance with the present invention generally does not cross over a sharp transition region or step on (or over) a transistor channel, etc. in the printed semiconductor feature, which enables the use of metal gate materials (such as molybdenum, aluminum, and/or TiN) which may otherwise be severely thinned or discontinuous as deposited. In a conventional process, using such materials may require a high temperature resist reflow, thereby increasing the dimension of the formed feature, and a sloped etch and/or use of alloying elements in or for the gate electrode or other electrically active feature. For logic devices, elimination of sharp edges and relatively thin gate oxides may reduce a source of relatively less controllable variation, reduce current leakage, and improve threshold voltage control (which may be adversely affected by non-uniformity of the gate oxide).

A printed feature having rounded edges and a dome-shaped profile may also allow for uniform silicidation (or contact formation) across the (entire) surface of the dome. For a given dome area (e.g., footprint or outline of the feature on the device), the contact area may be larger than a lithographically defined feature of the same footprint or outline, thereby enabling a possible reduction in the ohmic resistance of the dome-shaped structure containing the metal silicide on its surface relative to an otherwise comparable photolithographically-defined feature.

A silicide-forming metal may be deposited over semiconductor surface by printing a metal ink composition as described above, or may be deposited by conventional techniques (e.g., CVD, ALD, sputter deposition, evaporation, etc.). In various implementations, a silicide-forming metal may be selected from the group consisting of Pd, Pt, Ni, Cr, Mo, W, Ru, Rh, Ti and alloys or mixtures thereof. In addition, the silicide-forming metal precursor may be dissolved in an organic solvent, a mixture of organic solvents, a mixture of one or more organic solvents and water; or a mixture of $H_2O$ with one or more additives that may be water-soluble or miscible with water, that (i) improve the printing characteristics [surface tension, viscosity, vapor pressure and/or evaporation kinetics] of the ink, (ii) have low spreadability on and do not react with a Si and/or $SiO_2$ surface, and/or (iii) evaporate during the printing, drying, and/or curing processes (see, e.g., copending U.S. patent application Ser. No. 12/131,002, filed May 30, 2008, the relevant portions of which are incorporated herewith by reference).

In preferred embodiments, the silicide-forming metal comprises or consists essentially of Pd. For example, a Pd ink may be selectively printed onto or over the exposed semiconductor (e.g., silicon) surface, and then annealed to form transistor contacts or other electrically functional structures. Alternatively, the silicide-forming metal can be conformally deposited over the semiconductor surface (e.g., source and drain terminals, and/or gates). Where the silicide-forming metal is deposited on or over a printed semiconductor structure having a smooth and/or dome-shaped profile, the resulting contact area may be larger than a contact area of a similarly sized, conventionally (e.g., lithographically) defined transistor structure because the contact metal can conformally cover substantially all of the smooth and/or dome-shaped surface, rather than just an upper surface of the conventional semiconductor or conductor feature.

The silicide-forming metal may then be cured and/or reduced to form metal-silicon contacts. For example, the silicide-forming metal may be exposed to a reducing agent and heated at a temperature ranging from greater than ambient temperature to about 100-700° C. (e.g., 150-400° C., or any other temperature range therein), depending on the metal precursor and/or substrate. Details of various methods to reduce the metal precursor are described in copending U.S. patent application Ser. No. 12/131,002, filed May 30, 2008, the relevant portions of which are incorporated herewith by reference. However, the metal precursor need not be reduced if an interconnect is not formed. A solvent or solvent mixture (e.g., $H_2O$; $NH_3$ or aqueous $NH_4OH$; relatively low molecular weight alcohols and esters, such as diethylene glycol butyl ether [butyl carbitol], tetrahydrofurfuryl alcohol, ethylene glycol, isopropanol, 2-butanol, ethyl acetate, hexanol, heptanol, and 2-pentanol; and/or other solvents disclosed in copending U.S. patent application Ser. No. 12/131,002, filed May 30, 2008, the relevant portions of which are incorporated herewith by reference) for the silicide-forming metal may selectively remove unreacted metal precursor from the metal silicide when the metal precursor is not reduced.

Optionally, the silicide-forming metal may be reduced to form a local interconnect or a seed layer for plating a bulk metal interconnect, thereby facilitating formation of electrical connections between terminals of the same or different devices. In such embodiments, the silicide-forming metal may be deposited (e.g., printed) from a precursor ink, which may further comprise a bulk conductor precursor, such as metal nanoparticles (e.g., Ag) and/or one or more silicide-forming metal salts, metal oxides and/or metal complexes (see, e.g., U.S. Pat. Nos. 6,878,184, 7,084,276, 7,259,100, 7,259,101, and 7,294,449, and co-pending U.S. patent application Ser. Nos. 11/452,108, 11/818,078, 11/888,942, 11/888,949, 11/842,884 and 12/131,002, filed Jun. 12, 2006, Jun. 12, 2007, Aug. 3, 2007, Aug. 3, 2007, Aug. 21, 2007, and May 30, 2008, the relevant portions of which are incorporated herewith by reference).

The silicide-forming metal and silicon surface are then heated to a first temperature for a length of time sufficient to form a silicon contact (e.g., metal silicide). In some embodiments, a native oxide may be on the exposed silicon surface prior to selective deposition of the silicide-forming metal. In various embodiments, a bulk conductive metal (not shown) may be selectively deposited by electro- or electroless plating on the reduced silicide-forming metal from the metal precursor ink, which provides a seed layer for forming a metal interconnect from the bulk conductive metal.

Printing liquid ink compositions in accordance with the presently disclosed methods may provide printed features with anisotropic shapes (e.g., having differing width, length and height values, or having at least two different predetermined values for at least one of the width and/or length dimensions of the feature, along the entirety of the other dimension), and a smooth and/or dome-shaped cross-sectional profile that varies smoothly in at least one dimension, as seen in the cross-sectional view of FIG. 2 (see, e.g., U.S. patent application Ser. No. 12/114,741, filed May 2, 2008, and U.S. patent application Ser. No. 11/842,884, filed Aug. 21, 2007, the relevant portions of which are incorporated herein by reference). Anisotropic shapes that are printable using the present invention include lines, rectangles, T shapes, L shapes, H shapes, dumbbell shapes, tabs (e.g., orthogonal or angled extensions from a main or primary shape), and combinations thereof. The resulting structures have rounded edges and a smooth and/or dome-shaped profile along at least one axis of the printed feature. Naturally, the present invention is also applicable to isotropic shapes, such as circles and squares.

Exemplary Top-Gate Transistors and Methods of Making the Same

An aspect of the present invention relates to a transistor and methods of making a transistor structure, steps of which are illustrated in FIGS. 4A-4D. The transistor gate layer may be above the transistor source, channel, and drain (a so-called "top gate" transistor, although the presently disclosed methods are equally effective for forming devices having other structural arrangements, such as bottom gate transistors). The source/drain terminal layer comprises a printed, dome-shaped, doped semiconductor thin film feature. The transistor gate layer may comprise a conventional semiconductor material, a conventional conducting material, or a laminate of two or more conventional semiconductor and/or conducting materials (e.g., heavily doped silicon with a transition metal silicide, as described above). The transistor may further comprise a contact structure and/or one or more metallization structures in physical and/or electrical contact with the source and drain structures of the source/drain terminal layer (and optionally, in physical and/or electrical contact with the gate layer).

Figure 4A:
FIGS. 4A-4D show cross-sections and a layout view of exemplary printed semiconductor, dielectric and/or conductor structures or layers having smooth and/or dome-shaped cross-sectional profiles, in an exemplary method of making a transistor.
Figure 4B:
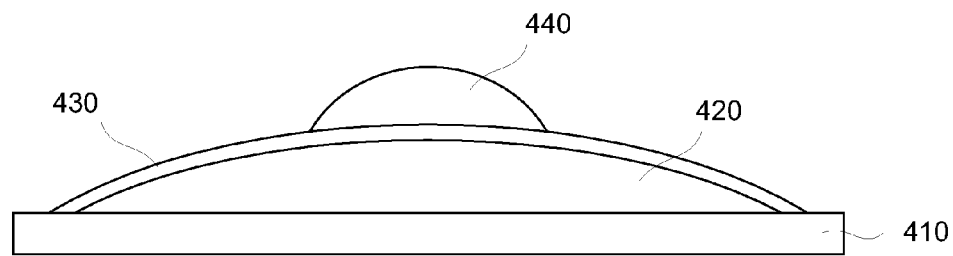
Figure 4C:
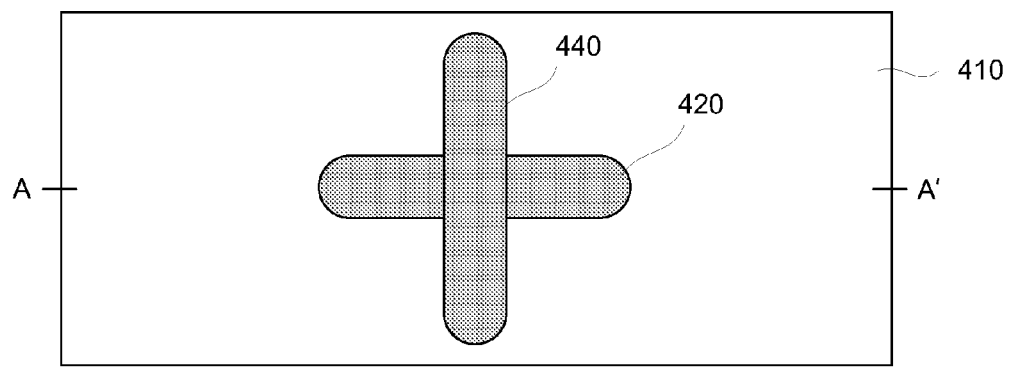
Figure 4D:
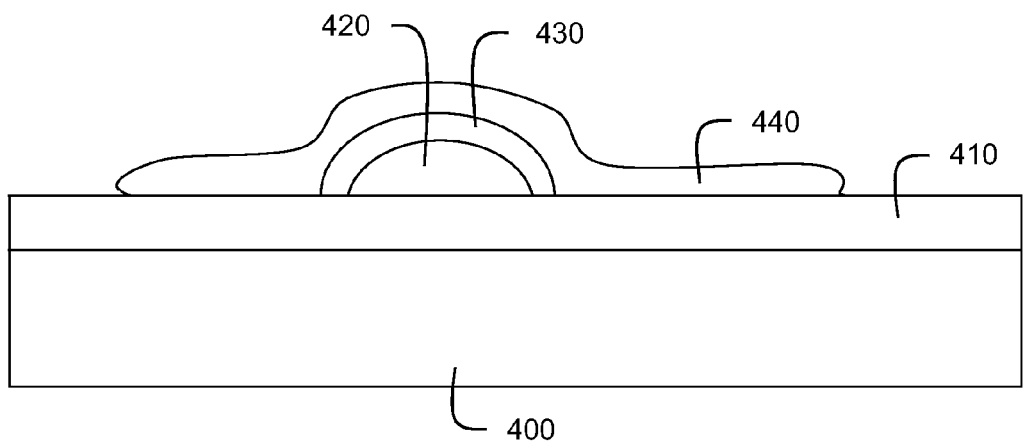

FIGS. 4B, 4C and 4D each show an exemplary gate-channel crossover. FIG. 4C shows a top down view of the transistor (without contacts), where a gate 440 crosses over a semiconductor layer 420 at a right angle. FIG. 4B shows a cross-sectional view of the transistor of FIG. 4C along axis A-A', and FIG. 4D shows a cross-sectional view of the transistor of FIG. 4C along the length of gate 440, orthogonal to axis A-A'.

The exemplary transistor of FIGS. 4B, 4C and 4D has a smooth and/or dome-shaped semiconductor layer 420 and a gate 440 that crosses over the semiconductor layer 420 at an angle, preferably orthogonally. A gate dielectric 430 lies between semiconductor layer 420 and gate 440. The gate dielectric 430 may be a conventional dielectric (e.g., silicon dioxide or silicon nitride formed by plasma enhanced chemical vapor deposition [PECVD], evaporation or ALD, or alternatively, a spin-on-glass [SOG], etc.), but it is preferably a thermal oxide layer. The gate dielectric 430 between the semiconductor layer 420 and the gate 440 has a substantially uniform width. In a preferred embodiment, the gate 440 has a smooth and/or dome-shaped profile like that of semiconductor layer 420.

FIGS. 4A-4B shows an exemplary process flow for making a printed channel and a printed gate for an exemplary thin film transistor. FIGS. 4A-4B show a cross-sectional view of the transistor of FIG. 4C along axis A-A'.

In general, a semiconductor layer (e.g., silicon) 420 is formed on a substrate 410. In a preferred embodiment, semiconductor layer 420 is formed by printing (preferably inkjet printing) an ink composition comprising a semiconductor precursor in accordance with the semiconductor compositions described above (e.g., a (poly)silane or hetero(poly)silane). In the preferred embodiment, the continuous semiconductor layer 420 is formed by printing a liquid-phase ink containing a silicon and/or germanium precursor in a pattern onto the substrate. In the preferred embodiment, the cross-sectional profile of the semiconductor layer 420 is substantially smooth and/or dome-shaped. The semiconductor layer 420 preferably forms a feature in a transistor, specifically a channel layer.

Subsequently, as shown in FIG. 4B, a gate dielectric 430 (e.g., formed by wet or dry thermal oxidation, gas-phase deposition [e.g., CVD, PECVD, high density plasma [HDP]-CVD, ALD, etc.], evaporation, or liquid-phase deposition [e.g., see copending U.S. patent application Ser. Nos. 11/452,108, 11/818,078, 11/888,942, 11/888,949, and 11/842,884, filed on Jun. 12, 2006, Jun. 12, 2007, Aug. 3, 2007, Aug. 3, 2007, and Aug. 21, 2007, respectively, the relevant portions of which are incorporated herein by reference) is formed on the semiconductor layer 420. Preferably, the gate dielectric layer 430 is formed by thermal oxidation. Thermal oxidation of semiconductor layer 420, which has a smooth and/or dome-shaped profile absent of sharp transitions, results in a substantially uniform oxide layer that completely covers the semiconductor layer 420. The gate dielectric layer 430 may also completely cover the semiconductor layer 420 if formed by other techniques (e.g., CVD, PECVD, HDP-CVD, ALD, liquid phase deposition, evaporation, etc.). Subsequently, the gate dielectric layer may be patterned (e.g., by photolithography or printing a mask layer, and etching) to expose a contact area on the semiconductor layer 420. Alternatively, the gate dielectric layer 430 may be selectively printed over predetermined areas of the semiconductor layer 420. Specifically, the gate dielectric layer 430 may be printed in a predetermined area of the semiconductor layer 420 where a gate 440 will be deposited.

The gate dielectric layer 430 may have a thickness of from 20 Å to 400 Å or any range of values therein (e.g., from 30 to 300 Å, or from 50 to 200 Å, etc.). Preferably, in cases where the gate dielectric 430 is formed by thermal oxidation of semiconductor layer 420, the gate dielectric layer has a thickness that is less than 100 Å.

A gate 440 may be formed on the gate dielectric 430. In a preferred embodiment, gate 440 is formed by printing (preferably inkjet printing) an ink composition comprising a semiconductor precursor in accordance with the semiconductor compositions described above (e.g., a (poly)silane precursor). Alternatively, the gate may be formed by printing an ink composition comprising a metal precursor, as described above. As shown in FIG. 4B, the preferred embodiments provide a gate 440 that has a smooth or dome-shaped cross-sectional profile. In a further alternative, the gate 440 may be formed by conventional deposition and patterning (e.g., chemical vapor deposition and lithographic patterning) of an electrode material (e.g., a semiconductor or conductor material as described above). However, to facilitate formation of a contact to the gate 440, preferably, the gate 440 has a smooth and/or dome-shaped profile, as described herein. Portions of the gate dielectric layer 430 exposed by the gate 440 can then be removed by conventional techniques (e.g., a wet or dry etch that is selective for oxide removal). As illustrated in FIGS. 4C-4D, the gate 440 is printed over and across the semiconductor layer 420, preferably at an orthogonal orientation.

In one embodiment, the structure shown in FIG. 4B may be oxidized (e.g., by dry or wet thermal oxidation, as described above) to form an oxide layer (not shown) over the gate 440 (e.g., after the dome-shaped gate has been cured). The thermal oxide layer may then be removed (e.g., by isotropic etching) to expose the gate 440 and effectively reduce the feature sizes (e.g., length, width, and height) of the gate 440 (see the paragraphs above). The exposed portions of the gate dielectric 430 over the semiconductor layer 420 can be simultaneously etched with the thermal oxide. Subsequent processing can be performed as described elsewhere (e.g., U.S. patent application Ser. Nos. 11/452,108, 11/818,078, 11/888, 949, 11/888,942, 12/114,741 and 12/131,002, filed on Jun. 12, 2006, Jun. 12, 2007, Aug. 3, 2007, Aug. 3, 2007, May 2, 2008, and May 30, 2008, respectively, the relevant portions of which are incorporated herein by reference.

Exemplary Capacitors and Methods of Making the Same

Figure 5A:
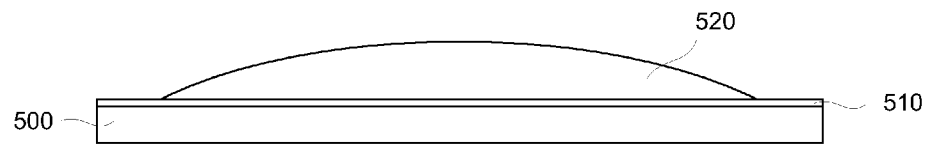
FIGS. 5A-5C show cross-sections of exemplary printed semiconductor, dielectric and/or conductor structures or layers having smooth and/or dome-shaped cross-sectional profiles, in an exemplary method of making a capacitor.
Figure 5B:
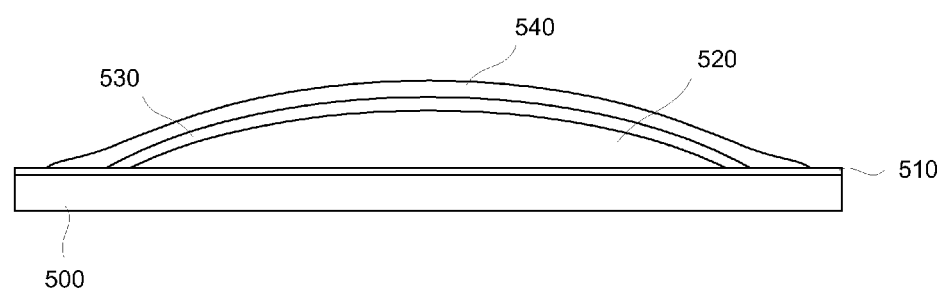
Figure 5C:
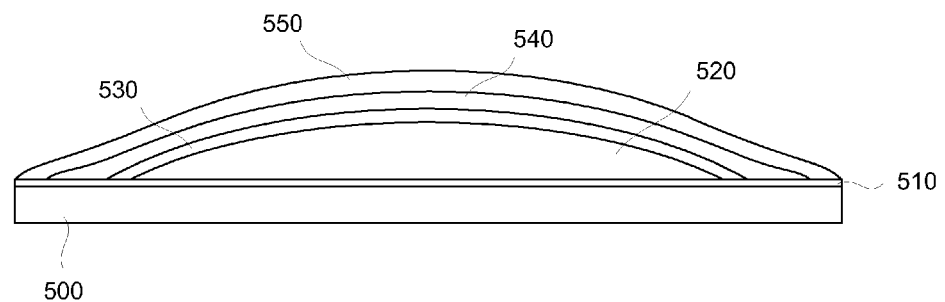

Another aspect of the present invention relates to thin film capacitors and methods of making a thin film capacitor (e.g., a metal-oxide-semiconductor [MOS] capacitor, or a metal-insulator-metal [MIM] capacitor), the steps of which are illustrated in FIGS. 5A-5C. The thin film capacitor may have one or more layers that have a smooth and/or dome-shaped profile, which allows for a larger interfacing surface area between capacitor layers than in a similarly sized conventionally (e.g., lithographically) defined capacitor structure because the conductor, semiconductor, or dielectric layers formed over a lower smooth or dome-shaped capacitor layer can conformally cover the smooth and/or dome-shaped feature, rather than just an upper surface of the conventional semiconductor or conductor. The increased interface area provides increased capacitance without increasing a critical dimension of the capacitor structure. The smooth and/or dome-shaped profile allows for additional advantages as discussed above.

FIGS. 5B and 5C show cross-sectional views of exemplary thin film capacitors. FIG. 5B shows a MOS embodiment of a thin film capacitor. The MOS thin film capacitor comprises a lower metal layer 520 (e.g., an Al layer) formed over a substrate 500 having a dielectric layer 510 thereover. A dielectric layer 540 (e.g., an oxide layer, such as $SiO_2$ [e.g., formed by blanket deposition such as CVD, PVD, or ALD, evaporation, or by printing a silicon oxide layer, or $Al_2O_3$ [which may be formed by anodizing the lower metal (e.g., Al) layer 520], a spin-on-glass [SOG], silicon nitride, etc.) covers the lower metal layer 520, and may be formed on lower metal layer 520. A doped semiconductor layer 540 is formed on the dielectric layer 530 by methods described herein. The doped semiconductor layer 540 may form an upper capacitor plate, as shown in FIG. 5B. Alternatively, a second metal layer (printed and/or deposited as described herein) may form the upper capacitor plate 540. Generally, some portion of the lower capacitor plate 520 will not have the upper capacitor plate 540 formed thereover. Removing part or all of the exposed capacitor dielectric 530 exposes a portion of the lower capacitor plate 520, for formation of a contact/metal interconnect thereto.

Further structures may be included, as shown in FIG. 5C, which shows a non-linear MIM embodiment of a thin film capacitor. Specifically, an upper metal layer 550 (e.g., of Al, an Al alloy, Ni, Ag, or a metal film as described above) is formed on the doped semiconductor layer 540. Alternatively, the capacitor layers may be reversed (e.g., upper metal on oxide on doped silicon on lower metal). In a further alternative, the doped semiconductor layer may be absent from the thin film capacitor. Further details regarding the exemplary thin film capacitor will be indicated in the following description of exemplary methods of forming the thin film capacitors shown in FIGS. 5B and 5C.

In general, a layer 520 (a first capacitor electrode or plate), as show in FIG. 5A, is formed by printing or coating a conductor (e.g., a metal layer) over a substrate 500 that may have a thin buffer or dielectric layer 510 thereon, and drying and curing the ink (generally by heating and/or annealing the dried ink for a length of time sufficient to increase a viscosity and/or reduce a volatility of the composition), as described above. The substrate 500 may include a conventionally grown or deposited oxide and/or nitride layer 510 (e.g., silicon dioxide, silicon nitride) thereon. Alternatively, the layer 520 may be a semiconductor layer formed preferably by printing (preferably inkjet printing) an ink composition comprising a semiconductor precursor as described above (e.g., a (poly)silane, (cyclo)silane, hetero(cyclo)silane, and/or silicon nanoparticles).

The metal-containing ink may be dried by conventional and/or otherwise known processes to evaporate the solvent and form a pinning line to define the lower metal layer 520, as described above. The metal precursor inks may be dried by heating the substrate having the printed metal precursor ink thereon at a temperature and for a length of time effective to remove the solvent and/or binder. The dried metal-containing material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying dielectric 510, as described above.

In an alternative embodiment, a precursor for a metal seed layer (e.g., comprising Ag, Al, Au, Cu, Pd, Pt, or any of the metals described above) may be printed over the substrate 500, and the desired metal (e.g., Ag, Al, Au, Cu, Pd, Pt, or any of the metals described above) may be electroplated or electrolessly plated onto the metal seed layer to form lower metal layer 520. The seed layer may require an activation and/or reduction step before the plating process (e.g., curing and/or annealing).

Subsequently, as shown in FIG. 5B, a dielectric 530 is formed on the lower metal layer 520, preferably by wet or dry thermal oxidation or, for certain metals (e.g. Al), anodic oxidation. Dielectric 530 may be formed by alternative techniques, as described above. Where dielectric layer 530 is formed by oxidation, the resulting oxide has a substantially uniform thickness over the whole surface of lower metal layer 520. Dielectric layer 530 may be a metal oxide (e.g., thermal or printed $Al_2O_3$). Dielectric 530 acts as an insulating layer, and is formed such that it covers lower metal layer 520 in areas over which the doped semiconductor layer 550 will be formed. The dielectric 530 may have a thickness of from 20 Å to 400 Å or any range of values therein (e.g., from 30 to 300 Å, or from 50 to 200 Å, etc.).

The dielectric 530 (e.g., when formed by thermal oxidation) may be thinner than it would be in a conventional capacitor because it may be formed to cover the lower metal layer 520 (where lower metal layer 520 has a smooth and/or dome-shaped profile) substantially uniformly. Thus, the dielectric layer need not be formed to a thickness that would ensure adequate coverage in a conventional capacitor. In such cases, the dielectric 530 may be formed to a thickness that is less than 100 Å.

A semiconductor layer 540 may be formed over the dielectric layer 530, preferably by printing (preferably inkjet printing) an ink composition comprising a semiconductor precursor as described above (e.g., a (poly)silane, (cyclo)silane, hetero(cyclo)silane, and/or silicon nanoparticles). The semiconductor layer 540 may be formed by alternative techniques (e.g., by PECVD, LPCVD, ALD, sputtering, evaporation etc.), as described above. Where the semiconductor layer 540 is printed, it may have one or more substantially smooth and/or dome-shaped cross-sectional profiles. The ink composition may further comprise a dopant (which may be B, P, As or Sb, but which is preferably B or P) in a concentration of from about $10^{16}$ to about $10^{21}$ atoms/cm$^3$. Alternatively, dopant may be implanted into the semiconductor layer 540 after the semiconductor layer 540 has been deposited. Typical semiconductor layer 540 thicknesses may be from about 30, 75 or 100 nm to about 200, 500 or 1000 nm, or any range of values therein. The film thickness may be chosen to optimize the electrical properties of the capacitor.

As shown in FIG. 5C, an upper metal layer 550 (a second layer for the upper capacitor electrode or plate) may be optionally formed on the semiconductor layer 540 (e.g., in the case of a nonlinear capacitor). In a preferred embodiment, second metal layer 550 is formed by printing (preferably inkjet printing) an ink composition comprising a metal precursor, as described above (metals are also discussed above). Alternatively, second capacitor electrode or plate 550 may be formed by conventionally depositing and patterning (e.g., PECVD, LPCVD, ALD, sputtering, etc., and lithographic patterning) or plating (e.g., electroplating or electrolessly plating) a conductor material, as described above. The upper metal layer 550 may have one or more smooth or dome-shaped cross-sectional profiles. Optionally, semiconductor layer 540 may be excluded and the upper metal layer 550 may be formed on dielectric layer 530.

Exemplary Floating Gate Memory Cells and Methods of Making the Same

Figure 6A:
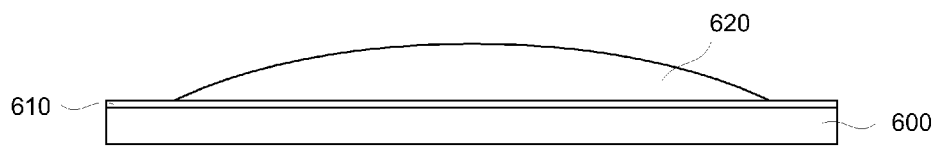
FIGS. 6A-6C and 6E-6F show cross-sections of exemplary printed semiconductor, dielectric, and conductor structures or layers having smooth and/or dome-shaped cross-sectional profiles.
Figure 6B:
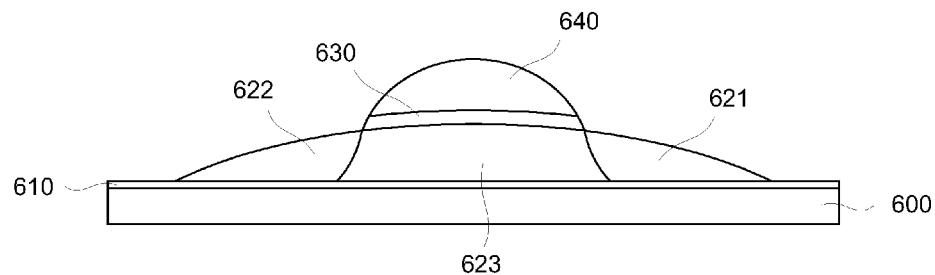
Figure 6C:
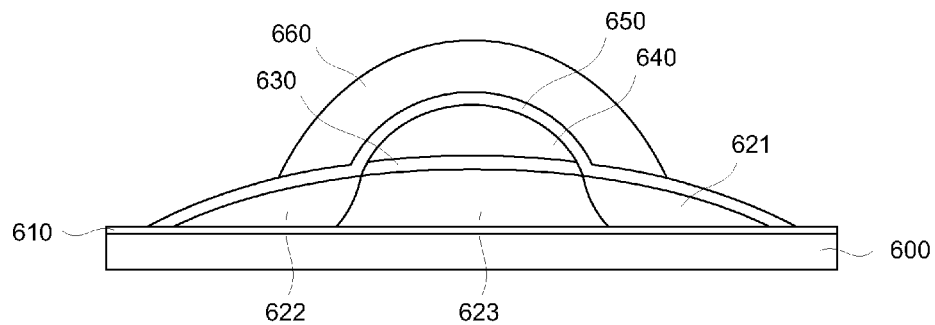
Figure 6D:
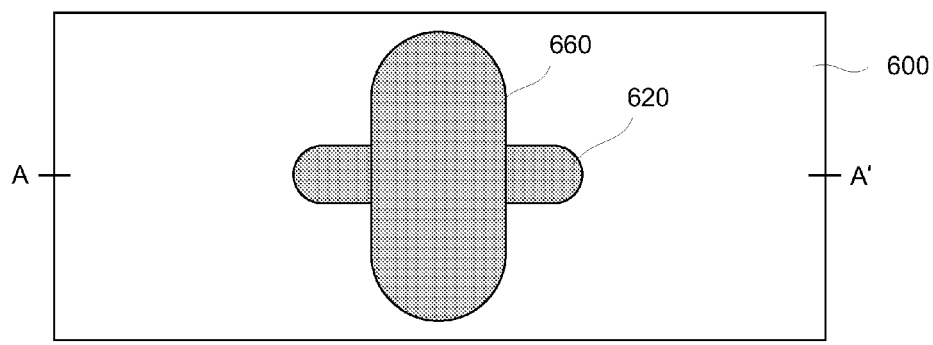
FIG. 6D shows a layout view of exemplary printed semiconductor and/or conductor structures, in an exemplary method of making a floating gate memory cell.
Figure 6E:
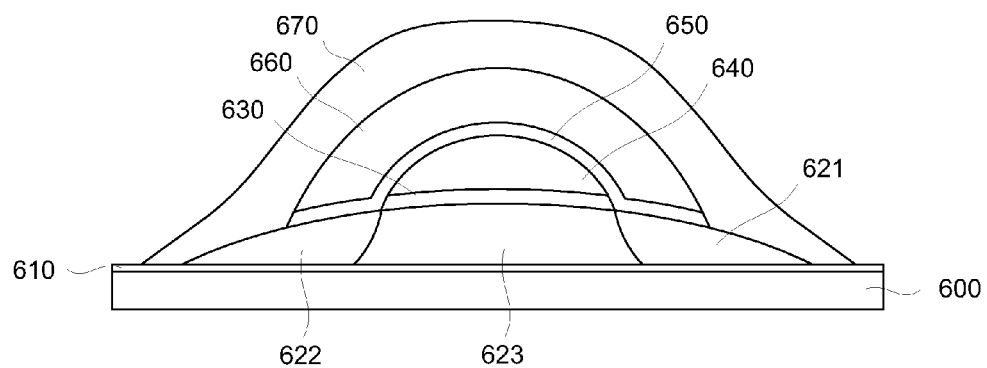
Figure 6F:
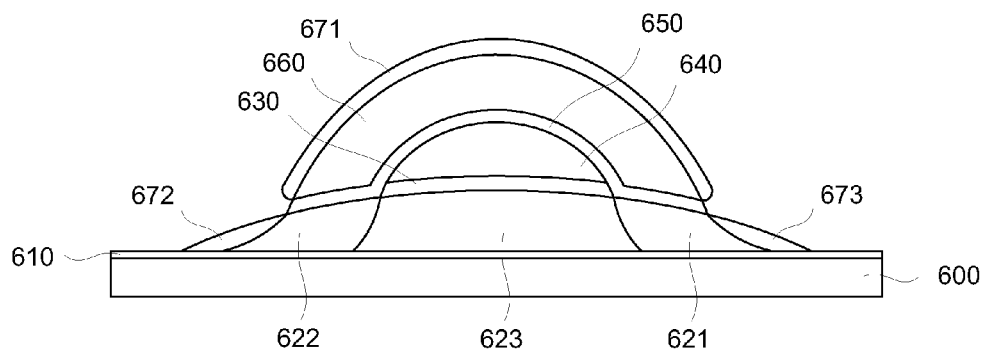

Yet another aspect of the present invention concerns a non-volatile memory cell and methods of making non-volatile memory cells, the steps of which are illustrated by the diagrams in FIGS. 6A-6F. An exemplary non-volatile memory cell is shown in FIGS. 6C and 6F. The exemplary non-volatile memory cell comprises first and second printed structures, the first printed structure 620 comprising a channel layer and source and drain terminals, and the second printed structure 640 comprising a floating gate; a tunneling dielectric layer 630 on at least part of the first structure 620; a gate dielectric layer 650 on at least part of the second structure 640; a control gate 660 on at least part of the gate dielectric layer 650; and a metal interconnect layer 670 in electrical contact with the control gate 660 and the source and drain terminals. In one embodiment, the metal interconnect layer may include a uniform silicide layer 671, as in the exemplary non-volatile memory cell shown in FIG. 6F. Further details regarding the exemplary non-volatile memory cells will be indicated in the following description of exemplary methods of forming the non-volatile memory cells shown in FIGS. 6C and 6F.

The present memory cell may be fabricated in part by printing a silicon and/or metal inks to form the active transistor layer(s), the printed transistor layers having smooth or dome-shaped profiles allowing uniform thermal oxidation, isotropic etching characteristics, and conformal uniform coverage of transistor layers by layers deposited thereover. As an enhancement, sequential lateral laser solidification and/or crystallization of printed islands of silicon can improve carrier mobility and gate oxide interface quality.

FIGS. 6A-6C and 6E-6F show an exemplary cross-sectional structures formed in an exemplary process flow for making a printed non-volatile memory (e.g., an "all-printed" EEPROM transistor). FIGS. 6C and 6F are cross-sectional views of the structure of FIG. 6D along axis A-A'.

Substrate 600, as shown in FIG. 6A, generally comprises a conventional mechanical support structure, which may be electrically inert or electrically active, and which may further include one or more advantageous and/or desired electrical and/or optical properties, as described above. Preferably, the substrate 600 comprises a member selected from the group consisting of a silicon wafer, a glass plate, a ceramic plate or disc, a plastic sheet or disc, metal foil, a metal sheet or disc, and laminated or layered combinations thereof. The substrate 600 may further include a conventionally grown or deposited oxide and/or nitride layer or other barrier, passivation, planarization or insulating layer 610 (e.g., silicon dioxide, silicon nitride, TiN, etc.) thereon.

In one embodiment, the first island 620 (which may be a semiconductor thin film) is formed by printing or coating semiconductor precursor inks (e.g., an ink comprising (poly)silane precursor, such as a Group IVA element-containing material such as Si and/or Ge) over the substrate 600 (including the dielectric layer 610), then converting the ink to a thin film (e.g., by heating and/or curing), as described above. In certain preferred embodiments, printing comprises inkjetting. After deposition (and generally, at least some drying), the first island 620 is generally cured by heating to form an amorphous, hydrogenated doped or undoped semiconductor (e.g., a-Si:H) layer. The curing/heating step may remove unwanted precursor/ink components or byproducts such as volatile carbon-containing species, or reduce the hydrogen content of the amorphous, hydrogenated semiconductor (e.g., a-Si:H) layer (which is particularly advantageous if laser crystallization is to be used after semiconductor film formation). The curing/heating step may also activate a dopant in that may be present in the printed semiconductor precursor ink, but in many embodiments, dopant activation may be more likely to occur during a subsequent laser crystallization step.

The first island 620 may comprise or consist essentially of a lightly doped inorganic semiconductor material, such as one or more Group IVA elements (e.g., silicon and/or germanium), which may further contain a dopant (such as B, P, As or Sb) in a concentration of from $\sim 10^{16}$ to $\sim 5 \times 10^{18}$ atoms/cm$^3$. In a preferred embodiment, the first island 620 generally comprises or consists essentially of one or more Group IVA elements, preferably silicon or silicon-germanium. When formed from a silane-based ink, the lightly doped semiconductor film may have a concentration profile (e.g., dopant concentration as a function of semiconductor layer thickness) in an amorphous state that is substantially uniform throughout substantially the entire thickness of the semiconductor layer.

The first island 620 has an area defined by a width and a length that are in accordance with the description above. The smooth or dome-shaped profiles of the presently disclosed semiconductor features allows for controlled and substantially uniform isotropic etching (e.g., by wet etching or plasma etching) of the semiconductor features. This provides a simple and efficient method of reducing critical dimensions of the presently disclosed semiconductor features.

In accordance with the methods described above, the printed (or deposited) and cured island 620 may be (re)crystallized by sequential lateral solidification (SLS) and/or laser crystallization to improve carrier mobility and gate oxide interface quality. Such (re)crystallization may significantly improve the TFT subthreshold slope (e.g., provide steeper turn on characteristics), which allows for a better separation between the zero and one states stored in the memory cell.

FIG. 6B shows the formation of dielectric layer 630 on the first island 620. Dielectric layer 630 (a tunnel dielectric layer) may be formed by thermal oxidation in an atmosphere containing an oxidizing and/or nitriding agent (e.g., dioxygen, ozone, water vapor, dinitrogen, nitrous oxide, nitric oxide, NO, ammonia, a combination thereof, etc.), or other conventional method (e.g., plasma-enhanced chemical vapor deposition (PE-CVD), low pressure CVD, atmospheric pressure CVD, high pressure CVD, ALD, or evaporation), as disclosed above.

The dielectric layer 630 may have a thickness of from 20 Å to 600 Å or any range of values therein (e.g., from 30 to 300 Å, or from 50 to 200 Å, etc.). The higher temperature processes enabled by use of a stainless steel foil substrate typically enable substantially enhanced tunnel dielectric properties, including lower defect rates, a lower number/concentration of interface states and lower leakage, which translates to superior subthreshold swing, carrier mobility and data retention.

A substantial advantage of the present process is that the printed first island 620 may have a smooth and/or dome-like cross-sectional shape, allowing for conformal formation of the dielectric 630 (e.g., a tunnel dielectric) over the first island 620 through deposition or thermal oxidation. Thus, sharp edges, which serve to inhibit oxide growth or which can give rise to undesirable issues for conformal deposition of subsequent materials, are avoided. Thus, certain failure modes for data retention loss through locally enhanced fields across the gate dielectric by enhanced leakage and/or breakdown are substantially eliminated. Such data retention loss tends to occur at points where the (floating) gate crosses over the edge of the island.

As shown in FIG. 6B, the present method may further comprise forming the second island 640 over the first island 620 and dielectric layer 630, preferably orthogonally to the first island 620. FIG. 6B shows a cross-sectional view of first island 620 with second island 640 thereon.

The second island 640 functions as a floating gate and may be formed in accordance with the techniques described above and/or with respect to the first island 620. The second island 640 may be formed, for example, by printing a suitable precursor (e.g. metal nanoparticles or organometallic compound(s), doped molecular and/or nanoparticle-based silicon ink(s), silicide precursor ink(s), etc.). In various embodiments, the second island 640 (floating gate) may comprise a printed material, and the printed second island 640 has a smooth and/or dome-shaped profile. The second island 640 may generally comprise a doped polysilicon, with or without a metal silicide and/or a refractory metal thereon. In one embodiment, the second island 640 comprises a doped Group IVA element (e.g., polysilicon containing an N-type dopant). Preferably, the N-type dopant comprises phosphorous. Use of doped silicon inks may further require and/or benefit from high temperature annealing and/or laser irradiation to form polycrystalline silicon and/or to activate the dopant to achieve sufficient electrical properties (e.g., conductivity).

In accordance with the methods described above, where second island 640 comprises a printed (or deposited) and cured semiconductor material, the semiconductor island may be (re)crystallized by sequential lateral solidification (SLS) and/or laser crystallization, similar to the first island 620. Where the second island 640 comprises a silicon material, the silicon island 640 may further comprise a metal silicide layer formed over the silicon material. A silicide-forming metal selected from the group consisting of nickel, cobalt, palladium, platinum, titanium, tungsten, and molybdenum may be deposited over the silicon material and annealed in accordance with the techniques described above. Alternatively, the second island 640 may comprise a substantially homogeneous metal silicide, which may be formed by printing an ink comprising one or more metal silicide precursor materials (e.g., a silicide-forming metal precursor and a silicon precursor in a solvent or solvent mixture adapted for printing, as described herein).

Alternatively, a seed layer precursor may be printed over the substrate 600 and the dielectric layer 630, and a floating gate metal (e.g. Ag, Au, Cu, Pd, Pt, etc.) may be electro- or electrolessly plated onto the seed layer. In some embodiments, the seed layer may require and/or benefit from an activation, reduction and/or annealing step before the plating process. Thus, forming the second island 640 may comprise printing a seed layer over the substrate 600 and dielectric layer 630, then electro- or electrolessly plating a floating gate material on the seed layer. In other embodiments, the second island 640 comprises a refractory metal selected from the group consisting of palladium, tungsten, and molybdenum. In yet another embodiment, the second island 640 comprises aluminum.

The metal- or silicon-containing ink may be dried by conventional and/or otherwise known processes, as described above. For example, precursor inks may be dried by heating the substrate containing the printed precursor ink thereon at a temperature and for a length of time effective to remove the solvent and/or volatile additives. The dried precursor material from the ink may be further annealed at a temperature and for a length of time sufficient to improve its electrical and/or physical properties (e.g., conductivity, morphology, electromigration and/or etch resistance, stress and/or surface strain, etc.) and/or its adhesion to the underlying dielectric layer 630.

In one embodiment, the second island 640 may be oxidized (e.g., by dry or wet thermal oxidation, as described above) to form an oxide layer (not shown) over the second island 640 (e.g., after the dome-shaped second island has been cured). The thermal oxide layer may then be removed (e.g., by isotropic etching) to expose the second island 640 and reduce the feature sizes (e.g., length, width, and height) of the second island 640 (see the paragraphs above). The exposed portions of the dielectric 630 (e.g., an oxide) over the first island 620 can be simultaneously etched with the thermal oxide. Alternatively, the second island 640 may be isotropically etched without the previous formation of an oxide layer thereover, resulting in a reduction in the feature sizes of the second island 640. Where the second island 640 is not thermally oxidized, or where dielectric 630 is not an oxide dielectric, the exposed portions of dielectric 630 over the first island 620 adjacent to the second layer 640 can be removed by a separate etching step, as shown in FIG. 6B.

Also shown in FIG. 6B, source and drain terminals 621 and 622, and a channel region 623 may be formed in the first island 620. In one embodiment, a doped dielectric layer (not shown) may be patterned or blanket deposited over the substrate, including the first and second islands 620 and 640. In an alternative embodiment, the doped dielectric layer may be printed (e.g., inkjet printed or screen printed). The substrate and the structures thereon are subsequently heated to diffuse the dopant into regions of the first island 620, thereby forming source and drain terminals 621 and 622. While regions of the semiconductor layer 620 are doped (e.g., structures 621 and 622, which may be source and drain terminals for the floating gate formed by the second island 640), a portion of the semiconductor layer 620, a channel region 623, remains undoped. If the second island 640 comprises (poly)silicon, the dopant will diffuse from the doped dielectric into the second island 640, forming the doped gate structure.

Alternatively, source and drain terminals 621 and 622 may be formed by forming a mask layer (e.g., a photoresist mask) that exposes areas of semiconductor layer 620 adjacent to the floating gate 640, and then implanting ions into the exposed areas of the underlying semiconductor layer 620 using the mask layer and, optionally, the second island 640 as a mask.

As shown in FIG. 6C, a gate dielectric layer 650 may be formed over the second island 640. If it is formed by thermal oxidation, gate dielectric layer 650 is also formed over the source and drain terminals 621 and 622. FIG. 6C further shows the formation of a control gate 660 over the gate dielectric layer 650. FIG. 6C is a cross-sectional view along axis A-A' of the structure shown in FIG. 6D.

Gate dielectric layer 650 may be formed by wet or dry thermal oxidation of the second island 640 and any exposed portions of the first island 620 (e.g., the source and drain terminals 621 and 622), as discussed above, although it can also be formed by blanket deposition (and optional annealing). In a preferred embodiment, the second island 640 has a smooth and/or dome-shaped profile, which allows an oxide layer formed there over by an oxidation process to have a uniform thickness and substantially complete coverage of the underlying electrically active feature. The gate dielectric layer 650 may have a thickness of from 20 Å to 400 Å or any range of values therein (e.g., from 30 to 300 Å, or from 50 to 200 Å, etc.). However, since the floating gate 640 must be unconnected to a conductor, there is no need to etch or otherwise expose any part of the floating gate 640 under the gate dielectric layer 650 (although openings exposing the source and drain terminals in the first island 620 must be present).

Alternatively, gate dielectric layer 650 may be formed by other conventional techniques, as described above (e.g., plasma-enhanced CVD, low pressure CVD, atmospheric pressure CVD, high pressure CVD, ALD, or evaporation). Thus, in various embodiments, forming the gate dielectric layer 650 may comprise plasma or low-pressure chemical vapor deposition of the dielectric layer, thermal oxidation of a surface of the second island 640, or liquid phase or chemical bath deposition of dielectric precursors onto the second island 640.

FIG. 6C further shows the formation of a control gate 660 on the gate dielectric layer 650 and over some or all of the floating gate 640 and a portion of semiconductor layer 620 (e.g., each of source and drain terminals 621 and 622). Preferably, the width and length of the control gate 660 are preferably greater than the respective width and length of the second island (floating gate) 640, primarily to maximize the coupling between the control gate 660 and the floating gate 640. As can be seen with reference to FIG. 6D, at least one of the width and/or length (preferably the length) of the control gate 660 may be substantially equal to at least one of the width and/or length (preferably the length) of the first island (transistor layer) 620. Furthermore, at least one of the width and/or length (preferably the width) of the first island (transistor layer) 620 may be substantially equal to the width and/or length (preferably the width) of the floating gate 640.

Control gate 660 may be formed by the methods described above. The control gate 660 may be formed by printing a suitable precursor (e.g. metal nanoparticles or organometallic compound(s), doped molecular and/or nanoparticle-based silicon ink(s), silicide precursor ink(s), etc.) on or over the gate dielectric layer 650, the floating gate 640 and part of the semiconductor layer 620. The control gate 660 can be formed by techniques the same as or similar to those for the first and/or second islands 620 and 640.

Also shown in FIG. 6C, dielectric layer 650 is partially removed from areas of the source and drain terminals 621 and 622 that are exposed by the control gate 660. After control gate 660 is formed, exposed areas of the dielectric layer 650 may be etched by conventional methods (e.g., isotropic wet etch selective for silicon oxide, or an anisotropic dry etch) using the control gate 660 as a mask. The removal of dielectric layer 650 exposes portions of the surface of the island 620 at the source and drain terminals.

FIG. 6E shows the deposition of a silicide-forming metal 670, which forms a silicide layer on the control gate 660 and contacts to the source and drain terminals 621 and 622.

In various embodiments, the silicide-forming metal 670 may comprise a printed material, generally made of an ink containing a silicide-forming metal or precursor therefor (as described above; metals are also discussed above) that may include (organo)metallic compounds, complexes, and clusters, as well as the metal nanoparticles, may include known compounds, complexes, clusters and/or nanoparticles of metals. The ligands, passivating agents, complexing and/or coordinating species, or other species included in or combined with such metal compounds, complexes, clusters and/or nanoparticles may be any that are capable of providing an electrically active film upon further processing of the ink.

Printing the silicide-forming metal 670 precursor (and/or seed layer for forming a metal interconnect) may include any of the printing techniques described above (metals are also discussed above). Alternatively, patterning the metal 670 may include coating or printing a precursor of the metal and locally exposing it to laser radiation such that the radiated portion changes its solubility characteristics in the exposed areas.

In certain embodiments, the silicide metal is selected from the group consisting of nickel, cobalt, palladium, platinum, titanium silicide, tungsten, and molybdenum. After being deposited, the silicide metal is annealed to form a silicide layer 671 and silicide contact 672, 673, as shown in FIG. 6F. When the control gate 660 has a smooth and/or dome-shaped profile, the silicide 671 may be formed such that it has a substantially uniform thickness and completely covers the control gate 660. Alternatively, the silicide-forming metal layer can be conformally deposited over an entire gate structure having a smooth or dome-shaped profile.

In an alternative embodiment, an interconnect metal may be plated, printed or laser written onto a seed layer of metal (e.g., Pd) resulting from the formation of the metal silicide 671-673 by selectively depositing (e.g., by electroless or electroplating) a bulk conductor (e.g., Co, Ni, Cu, Pd, etc.) onto the metal seed layer, as described above.

Exemplary Diodes and Methods of Making the Same

Figure 7A:
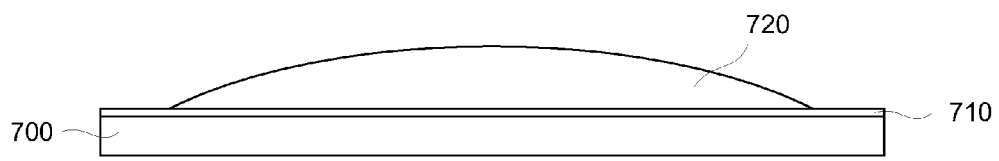
FIGS. 7A-7C show cross-sections of exemplary printed semiconductor and/or conductor structures or layers having smooth and/or dome-shaped cross-sectional profiles, in an exemplary method of making a diode.
Figure 7B:
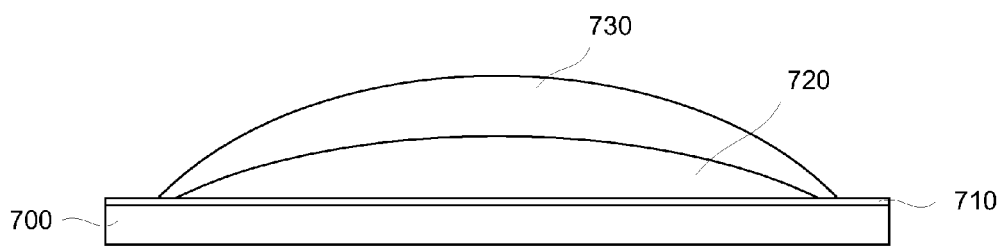
Figure 7C:
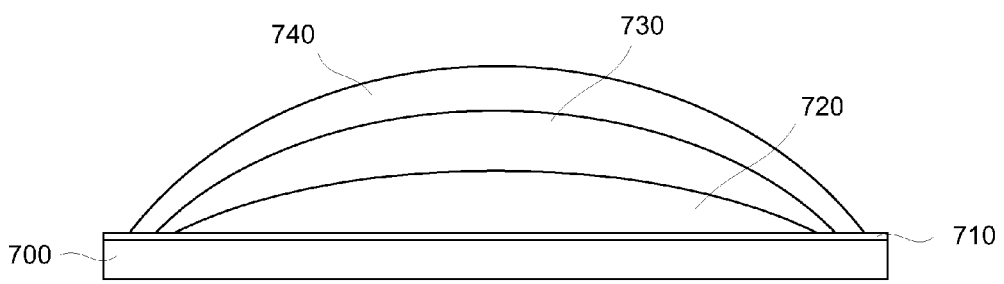

Another aspect of the present invention relates to thin film diodes and methods of making thin film diodes, the steps of which are illustrated in FIGS. 7A-7C. In preferred embodiments comprise a Schottky diodes and methods of making the same. However, the methods disclosed herein are capable of forming other types of diodes (e.g., p-n diodes, Zener diodes, etc. for use in image sensors, wireless devices, etc.). The thin film diode may have one or more layers that have one or more smooth and/or dome-shaped profiles, which allows for more uniform and conformal deposition or growth of layers formed thereover than a conventionally (e.g., lithographically) defined diode structure, and other advantages as discussed above.

FIG. 7C shows a cross-sectional view of an exemplary thin film diode (e.g., a Schottky diode). The exemplary thin film diode may comprise a heavily n-doped semiconductor layer 720 over a semiconductor substrate 700 having a dielectric layer 710 thereon. The heavily doped layer 720 preferably comprises a crystallized Group IVA element-containing material (e.g., Si and/or Ge). One or more lightly N-doped and preferably crystallized semiconductor layers 730 may be formed on the heavily doped layer 720. A metal layer 740 (e.g., of Al, an Al alloy, Ni, Ag, or another metal(s) as described above) is formed on the one or more lightly N-doped semiconductor layers 730. Further details regarding the exemplary thin film diode(s) will be indicated in the following description of exemplary methods of forming the thin film diode shown in FIG. 7C.

As shown in FIG. 7A, the exemplary method comprises forming or depositing a heavily doped semiconductor layer first, before formation of other functional layers in the diode (e.g., a Schottky diode). The diode may be formed by first forming a heavily n-doped semiconductor layer 720 over a semiconductor substrate 700. Substrate 700 generally comprises a conventional mechanical support structure, which may be electrically inert or active, and which may further include one or more advantageous and/or desired electrical and/or optical properties, as described above. In the case where the substrate comprises a metal sheet and/or foil, the device may further comprise an inductor, capacitor, and/or other devices, and the method may further comprise forming an inductor and/or capacitor from the metal substrate. Substrate 700 preferably has a dielectric material on the deposition surface, such as a conventionally grown or deposited oxide and/or nitride layer 710 (e.g., silicon oxide, silicon nitride).

Heavily doped semiconductor layer 720 is preferably formed by printing (e.g., inkjet printing) an semiconductor ink composition (e.g., an ink comprising (poly)silane precursor, such as an amorphous Group IVA element-containing material such as Si and/or Ge) over the substrate 700 (including the dielectric layer 710), and then drying, and curing/annealing the ink composition as described above. Alternatively, one may conventionally deposit the heavily doped semiconductor layer 720 (e.g., by evaporation, physical vapor deposition, sputtering of an elemental target, or chemical vapor deposition [e.g., PECVD, LPCVD, ALD, blanket deposition, evaporation, etc.], as described above). The ink composition may further comprise a dopant (which may be an n-type dopant such as P, As or Sb, but which is preferably P) in a concentration of from about $10^{18}$ to about $10^{21}$ atoms/$cm^3$. Alternatively, dopant may be implanted into the semiconductor layer 720 after the semiconductor layer 720 has been deposited. In an alternative embodiment, the semiconductor layer may be heavily doped with a p-type dopant (e.g., B or $BF_3$) by the techniques described in this paragraph and in above paragraphs.

After deposition, the ink composition may be dried and cured (generally by heating and or annealing the dried ink for a length of time sufficient to cross-link, oligomerize and/or polymerize the semiconductor precursor, and/or increase an average molecular weight, increase a viscosity, and/or reduce a volatility of the composition), as described above to form an amorphous, hydrogenated doped or undoped semiconductor (e.g., a-Si:H) layer. After curing is performed, the heavily doped semiconductor layer 720 may be partially or substantially completely crystallized to form a doped polycrystalline (e.g., polysilicon) film. The heavily doped semiconductor layer 720 is preferably crystallized before subsequently depositing further layers.

The film thickness of the heavily doped semiconductor layer 720 may be chosen to optimize the electrical properties of the diode. Typical thicknesses for the heavily doped semiconductor layer 720 may be from about 10, 25, 50, or 100 nm to about 200, 500 or 1000 nm, or any range of values therein. In addition, the heavily doped semiconductor layer 720 may have a width of at least 5, 8 or 10 μm, up to 50, 100, or 200 μm or more, or any range of values therein. The heavily doped semiconductor layer 720 may have a length (a length dimension of the heavily doped semiconductor layer 720 is not shown in FIGS. 7A-7C) of at least 1, 2, 5, 10 or 20 μm, up to 20, 50 or 100 μm or more, or any range of values therein.

Thereafter, as shown in FIG. 7B, one or more lightly doped (preferably n-doped) semiconductor layers 730 are similarly deposited or printed over the heavily doped semiconductor layer 720. Lightly doped semiconductor layers 730 (preferably one semiconductor layer) may be formed in accordance with the techniques disclosed above. In various embodiments, the lightly doped semiconductor layers 730 may comprise or consist essentially of a lightly doped semiconductor material, such as one or more Group IVA elements (e.g., silicon and/or germanium), which may further contain an n-type dopant (such as P, As, or Sb) in a concentration of from $\sim 10^{16}$ to $\sim 5 \times 10^{18}$ atoms/$cm^3$. Alternatively, one may conventionally deposit the heavily doped semiconductor layer 720 (e.g., by evaporation, physical vapor deposition, sputtering of an elemental target, or chemical vapor deposition [e.g., PECVD, LPCVD, ALD, blanket deposition, etc.], as described above).

When formed from a semiconductor precursor ink (e.g., containing a (poly)silane precursor), the lightly doped semiconductor film may have a concentration profile (e.g., dopant concentration as a function of semiconductor layer thickness) in an amorphous state that is substantially uniform throughout substantially the entire thickness of the semiconductor layer. In a preferred embodiment, the lightly doped semiconductor layers 730 generally comprise or consist essentially of one or more Group IVA elements, preferably silicon or silicon-germanium.

Typical thicknesses for the one or more lightly doped semiconductor layers 730 may be from about 10, 25, 50, or 100 nm to about 200, 500 or 1000 nm, or any range of values therein. The film thickness may be chosen to optimize the electrical properties of the diode. In addition, the lightly doped semiconductor layer 730 may have a width of at least 5, 8 or 10 μm, up to 50, 100, or 200 μm or more, or any range of values therein. The one or more lightly doped semiconductor layers 730 may have a length (a length dimension of the one or more lightly doped semiconductor layers 730 is not shown in FIGS. 7A-7C) of at least 1, 2, 5, 10 or 20 μm, up to 20, 50 or 100 μm or more, or any range of values therein.

The one or more lightly doped semiconductor layers 730 may be then crystallized (and preferably, some or substantially all of the dopant therein activated) by furnace annealing or laser crystallization. The printed (or deposited) and semiconductor layers 720 and 730, and may be further (re)crystallized by sequential lateral solidification (SLS) and/or laser crystallization to improve carrier mobility.

As shown in FIG. 7C, a metal layer 740 may then be formed over the one or more lightly doped semiconductor layers 730, generally by printing or depositing a metal precursor ink composition over the doped semiconductor layers 730 in accordance with the techniques described above. Alternatively, a seed metal layer may be printed or otherwise deposited or formed on exposed surfaces of the structure shown in FIG. 7B, and a conductive metal may be selectively plated, deposited or printed thereon (optionally with subsequent thermal treatment or annealing to form a metal silicide when a thin layer of silicon is deposited) to form the metal layer 740. In further alternatives, the metal layer 740 may be formed in accordance with the methods disclosed above. In the disclosed embodiments, at least part of the heavily doped semiconductor layer 720 remains exposed after formation of the lightly doped semiconductor layer 730 and the metal layer 740, to facilitate forming a contact and/or metal interconnect to the heavily doped semiconductor layer 720.

It is well within the ability of one of ordinary skill in the art to make other types of diodes based on the disclosure herein. For example, N-i-P and P-i-N diodes (where "i" refers to an intrinsic semiconductor layer), N-P and P-N diodes, and variations thereof (e.g., P-N$^-$-N$^+$ diodes) where at least one of the N and P layers comprises a relatively lightly doped sublayer and a relatively heavily doped sublayer, any of which may have an overlying and/or underlying metal layer thereon and/or thereunder, are contemplated. One or more of the exemplary structures shown in FIGS. 7A-7C may also have their dimensions reduced (see the above discussion of FIGS. 8A-8C). Also, the exemplary transistors described herein can be readily configured as diodes if a source/drain terminal (e.g., the source) of the transistor is electrically connected to its gate using a metal interconnect, as described herein.

CONCLUSION/SUMMARY

Embodiments of the present invention relate to electrically active devices (e.g., capacitors, transistors, diodes, floating gate memory cells, etc.) having dielectric, conductor, and/or semiconductor layers and/or structures that have smooth and/or dome-shaped profiles. The present invention also includes methods of forming such devices by depositing or printing (e.g., inkjet printing) an ink compositions that include semiconductor, metal, and/or dielectric precursors to form electrically active features and structures. The embodiments provide structures that have a smooth and/or dome-shaped cross-sectional profile that allows for smooth transitions without encountering sharp steps, preventing feature discontinuities during deposition, and can allow for more complete step coverage of subsequently deposited structures. Additionally, the smooth and/or dome-shaped cross-sectional profiles allow for both the uniform growth of oxide layers over the structures by thermal oxidation, and substantially uniform etching rates of the entire surface of the structures by isotropic etching. Oxide layers resulting from the presently disclosed methods may have a uniform thickness and substantially complete coverage of the underlying electrically active feature. The latter characteristic allows for an efficient method of reducing a critical dimension of an electrically active structure (e.g., a gate or channel layer) by a simple isotropic etch. The disclosed methods allow for the preservation, reduction and/or improved uniformity of the critical and non-critical dimensions of the underlying electrically active features.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of making an electrically active device, comprising:
   a) printing a first ink composition comprising one or more first semiconductor and/or metal precursors onto a substrate, the first ink having one or more predetermined properties;
   b) curing the first precursor(s) to form a first electrically active layer having a smooth, dome-shaped profile; and
   c) forming a second electrically active layer conformally covering the first electrically active layer.

2. The method of claim 1, wherein the one or more first precursors are present in an amount of from 1 to 40% by weight of the first ink composition.

3. The method of claim 2, wherein the one or more first precursors are selected from the group consisting of (poly)silanes, (poly)germanes, (poly)germasilanes, and nanoparticles of silicon and/or germanium.

4. The method of claim 3, wherein said (poly)silanes, (poly)germanes, and (poly)germasilanes consist essentially of species having (i) at least 15 silicon and/or germanium atoms and (ii) hydrogen.

5. The method of claim 2, wherein the one or more first precursors comprise a compound, a complex, a cluster and/or nanoparticles of a metal selected from the group consisting of Zr, Hf, V, Nb, Ta, Cr, Mo, W, Mn, Re, Fe, Ru, Os, Co, Rh, Ir, Ni, Pd, Pt, Cu, Ag, Au, Zn, Cd, or a combination thereof.

6. The method of claim 2, wherein the ink composition further comprises a solvent in which the one or more first precursors are soluble, wherein the one or more predetermined properties include a viscosity of from 2 to 100 cP.

7. The method of claim 2, wherein printing comprises inkjet printing, gravure printing, offset lithography, screen printing, flexography or flexographic printing, microspotting, pen-coating, stenciling, stamping, syringe dispensing, pump dispensing, spray-coating, slit coating, extrusion coating, or meniscus coating the ink composition in a predetermined pattern on the substrate.

8. The method of claim 6, wherein printing the ink composition comprises:
   a) precipitating the one or more first precursors to form a pinned functional pattern; and
   b) substantially evaporating the solvent prior to curing the one or more first precursors.

9. The method of claim 8, wherein curing the one or more first precursors converts the one or more first precursors to a first electrically active material forming a first electrically active layer defined by said pinned functional pattern.

10. The method of claim 6, wherein said solvent comprises a $C_5$-$C_{10}$ alkane or a $C_5$-$C_{10}$ mono- or bicycloalkane substituted by up to 3 $C_1$-$C_4$ alkyl groups.

11. The method of claim 8, wherein precipitating the one or more first precursors comprises irradiating said ink with UV radiation.

12. The method of claim 1, further comprising thermally oxidizing the first electrically active layer to form a thermal oxide layer.

13. The method of claim 12, further comprising removing the thermal oxide layer, thereby reducing a width of the first electrically active layer.

14. The method of claim 1, wherein the second electrically active layer has a smooth, dome-shaped profile.

15. The method of claim 1, further comprising isotropically etching the first electrically active layer to reduce its width.

16. The method of claim 1, wherein the electrically active device is a capacitor, the first electrically active layer comprises a first metal layer, and the capacitor further comprises a dielectric layer between (i) the first electrically active layer and (ii) either the second electrically active layer or, if the substrate has a conductive surface material, the substrate.

17. The method of claim 1, wherein the electrically active device is a diode, the first electrically active layer comprises a first semiconductor layer, and the second electrically active layer comprises a metal layer or a second semiconductor layer having different properties than the first semiconductor layer.

18. The method of claim 1, wherein the electrically active device is a floating gate memory cell, and the first electrically active layer is a first semiconductor layer comprising a channel region and source and drain terminals adjacent to the channel region, the second electrically active layer comprises a second semiconductor layer, and the device further comprises a tunnel dielectric layer between the first electrically active layer and the second electrically active layer.

* * * * *